United States Patent

Nishi et al.

[11] Patent Number: 6,141,107
[45] Date of Patent: Oct. 31, 2000

[54] APPARATUS FOR DETECTING A POSITION OF AN OPTICAL MARK

[75] Inventors: Kenji Nishi; Nobutaka Magome; Masaharu Kawakubo, all of Kanagawa, Japan

[73] Assignee: Nikon Corporation, Tokyo, Japan

[21] Appl. No.: 08/561,158

[22] Filed: Nov. 21, 1995

Related U.S. Application Data

[63] Continuation of application No. 08/290,176, Aug. 15, 1994, abandoned, which is a continuation of application No. 08/167,329, Dec. 15, 1993, abandoned, which is a continuation of application No. 07/841,833, Feb. 26, 1992, abandoned.

[30] Foreign Application Priority Data

Feb. 28, 1991 [JP] Japan ................................ 3-034513
Aug. 6, 1991 [JP] Japan ................................ 3-219380

[51] Int. Cl.$^7$ ........................................... G01N 11/00
[52] U.S. Cl. ........................................ 356/401; 250/548
[58] Field of Search ............................ 356/399–401; 250/548, 559.3; 355/43, 53

[56] References Cited

U.S. PATENT DOCUMENTS

| | | |
|---|---|---|
| 4,362,389 | 12/1982 | Koizumi et al. . |
| 4,402,596 | 9/1983 | Kanatani .................................. 355/43 |
| 4,655,598 | 4/1987 | Murakami et al. ...................... 356/400 |
| 4,723,221 | 2/1988 | Matsuura et al. .................... 356/400 X |
| 4,780,617 | 10/1988 | Umatate et al. ......................... 250/548 |
| 4,814,829 | 3/1989 | Kosugi et al. . |
| 4,962,318 | 10/1990 | Nishi ....................................... 250/548 |
| 5,004,348 | 4/1991 | Magome ................................. 356/401 |
| 5,153,678 | 10/1992 | Ota .......................................... 356/401 |

Primary Examiner—Robert H. Kim
Attorney, Agent, or Firm—Anderson, Kill & Olick P.C.

[57] ABSTRACT

The relative positions of an alignment mark on a wafer and index marks on an index plate within an optical system are detected by image processing. The index marks are illuminated by an illuminating light which is independent of an illuminating light for the wafer mark. An image of the wafer mark by a return light from the wafer and images of the index marks by the independent illuminating light are simultaneously picked up by a CCD image pickup device and the position of the first mark is detected from a combined image of these images by image processing.

29 Claims, 14 Drawing Sheets

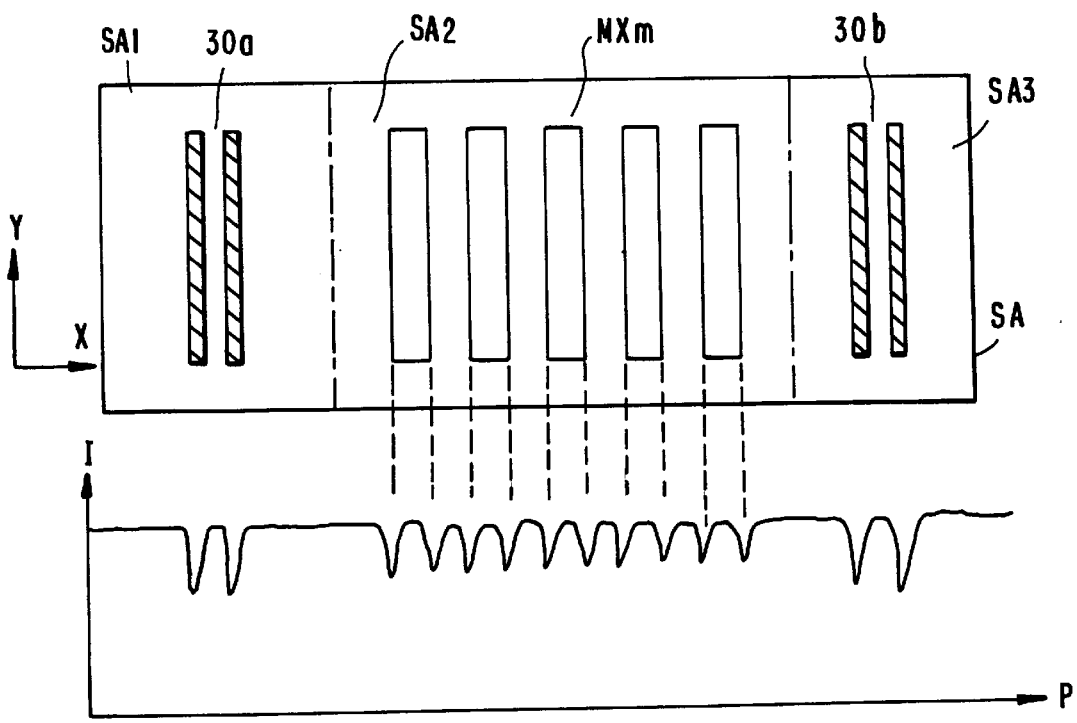
FIG. 19A
FIG. 19B
FIG. 20

APPARATUS FOR DETECTING A POSITION OF AN OPTICAL MARK

This is a continuation of Ser. No. 08/290,176 filed Aug. 15, 1994, now abandoned.

This application is a continuation of application Ser. No. 07/841,833, filed Feb. 26, 1992 now abandoned.

This application is a continuation of application Ser. No. 08/167,329, filed Dec. 15, 1993 now abandoned.

BACKGROUND OF THE INVENTION

1. Field of the Invention

The present invention relates to apparatus for detecting the position of an optical mark and more particularly to an apparatus so designed that during the alignment of a substrate such as a semiconductor wafer or plate for liquid crystal displays the position of each alignment mark formed on the substrate is detected photoelectrically.

2. Description of the Prior Art

In the registration of position (alignment) for a substrate such as a wafer or plate in the photolithographic step or the like, the systems of photoelectrically detecting the alignment marks formed at given positions on such substrate through a microscope objective lens have been used generally in the past. These photoelectric detection systems are also roughly divided into two types: the so-called light beam scanning type in which the marks are respectively scanned by a spot of laser beam or the like so that the resulting scattered beams or diffracted beams from the marks are received by a photomultiplier, photodiode or the like and the other type in which the magnified images of the uniformly illuminated marks are picked up by a television camera (e.g., a vidicon tube or CCD camera) so that the resulting image signals are utilized. In either of these cases, the resulting photoelectric signals are each subjected to waveform processing to determine the center position of the mark.

As these mark position detecting systems, there are known the conventional techniques disclosed in U.S. Pat. Nos. 4,655,598, 4,402,596 and Japanese Laid-Open Patent No. 62-65327, etc. In these conventional techniques, a monochromatic light is used as the scanning beam or the mark illuminating light and it is based on the following two reasons.

(1) In a projection exposure apparatus (stepper) of the type in which the wafer marks are detected through the projection optical system, an illuminating light or laser beam of a single wavelength is used to avoid the large chromatic aberrations of the projection optical system.

(2) A monochromatic laser beam is used so that it is condensed to a tiny spot for effecting a high-brightness and high-resolution detection.

While the use of a monochromatic illuminating light (or beam) has the effect of ensuring a relatively high S/N ratio, the wafers handled in the exposure apparatus are each usually formed all over the surface thereof with a photoresist layer of about 0.5 to 2 μm thick so that an interference pattern is produced at the photoresist layer thereby causing an erroneous detection during the mark position detection. Then, in recent years proposals have been made toward using illuminating light of multiple wavelength type or wider band type.

In the scanning apparatus of the image pickup type, for example, if a halogen lamp or the like is used as the illumination light source and the wavelength bandwidth of the illuminating light is selected about 300 nm (excluding the sensitizing region for the resist), there is caused practically no interference performance between the reflected light from the resist surface and the reflected light from the wafer surface thereby making possible the detection of a clear image. Thus, in the case of the image pickup type, by simply employing a white light (a wider band) for the illuminating light and making the imaging optical system achromatic, it is possible to obtain a position detecting apparatus which is not subjected to the effect of the resist and extermely high in accuracy.

An example of a conventional projection exposure apparatus equipped with such position detecting apparatus will now be described with reference to FIG. 18. As shown in the Figure, the projection exposure apparatus projects and exposes the pattern area PA on a reticle R firmly held on a holder 11 onto a wafer W (or a glass plate) through a projection lens 10. Then, during this exposure the center of the pattern area PA and the center of the corresponding shot area on the wafer W must be registered (aligned).

For this purpose, the wafer W is loaded on a stage 5 so that the stage 5 is moved two-dimensionally so as to align the reticle R with the wafer W. The movement of the stage 5 is effected by detecting the position on a reference coordinate system of a wafer mark MXn which is formed on the wafer W and then moving the stage 5 in accordance with this position information. As shown in FIG. 19A, this wafer mark MXn is in the form of multiple patterns including a plurality of line patterns arranged side by side. These multiple patterns are formed on a scribe line SCL provided around the shot area Sn on the wafer W.

This wafer mark MXn is detected by the optical system of the position detecting apparatus and the optical system is briefly shown as an off-axis type alignment system in FIG. 18. In the Figure, the illuminating light from a halogen lamp 1 is first transmitted through a bundle of optical fibers 2, passed through a lens system 3, a half mirror 4 and a lens 7 and is then reflected by a prism 9 to irradiate substantially vertically onto the wafer W. The reflected light from the wafer W returns through the same path, is reflected by the half mirror 4 through the prism 9 and the lens 7 and is focused on an index plate 13 by a lens 8. The index plate 13 is formed with index marks 30a and 30b. As shown in FIG. 19A, the index marks 30a and 30b are each composed of two-lines pattern consisting of straight line patterns which are extended in the Y direction and arranged at given intervals in the X direction.

The index plate 13 is arranged substantially conjugate to the wafer W through the lens 7 and the lens system 8. Therefore, an image of the wafer mark MXn on the wafer W is focused on the index plate 13 and the image of the wafer mark MXn and images of the index marks 30a and 30b are focused on an image pickup device 17 such as a CCD camera through relay systems 14 and 15 and a mirror 16. Then, in accordance with the resulting image signal from the image pickup device 17, the positional relation (positional deviations) between the index marks (30a, 30b) on the index plate 13 and the wafer mark MXn is detected by a main control system (CONT) 100. The index marks are used due to the drifting of the image scan starting position of the image pickup device 17. It is to be noted that although not shown, an illumination field stop is arranged within the lens system 3 at a position which is substantially conjugate to the wafer W and this field stop regulates the illumination area on the wafer W.

Here, the state of the portion corresponding to the illumination area and observed by the image pickup image 17 is shown in FIG. 19A. The illumination area on the wafer W is composed of an area SA2 corresponding to the wafer mark MXn and areas SA1 and SA3 respectively corresponding substantially to the index marks 30a and 30b, which are on the index plate 13, in the vicinity of the wafer mark MXn. The illumination area is defined so as to extend over the areas SA1 and SA3 on the ground that the light beams returning from the wafer areas SA1 and SA3 are utilized to transmit and illuminate the index marks 30a and 30b on the index plate 13. U.S. Pat. No. 4,962,318 discloses an image alignment technique employing such indices.

Thus, in order that the light for illuminating the index marks 30a and 30b may not be mixed with any noise components from the other marks and circuit pattern, the areas SA1 and SA3 are ones formed with no circuit pattern and mark and these areas are usually mirror finished. Such areas as the areas SA1 and SA3 are hereinafter referred to as forbidden bands.

Referring now to FIG. 19B, there is shown the video signal from the image pickup device 17 which then corresponds to the wafer alignment mark MXn and the index marks 30a and 30b. In the Figure, the ordinate represents the intensity I of the video signal and the abscissa represents the scanning position P of the stage 5. As shown in FIG. 19B, the video signal from the image pickup device 17 has a signal waveform in which the bottom is attained at each of the positions (picture element positions) corresponding to the positions of the index marks 30a and 30b and the edges of the wafer marks MXn. Also, it is assumed that a wafer alignment mark and index marks are provided in the Y direction and the Y-direction marks are detected by an image pickup device 18.

The above-mentioned conventional technique uses the return light from the wafer surface as the illuminating light for the index marks 30a and 30b on the index plate 13. As a result, if the surface of the wafer W is rough due to flaring, etc., the detection light beams from the index marks 30a and 30b contain noise components due to the roughening of the wafer surface. For instance, if any noise components are mixed with the video signal components generated from the image pickup device 17 in correspondence to the index marks 30a and 30b as shown in FIG. 20, it becomes difficult to discriminate the signals corresponding to the index marks 30a and 30b from the detection signal and a situation is caused in which the position of the wafer mark MXn cannot be detected accurately. In FIG. 20, the ordinate represents the signal intensity I and the abscissa represents the scanning position P of the stage 5.

Here, the wafer mark MXn is composed of the multiple patterns so that the signal corresponding to the wafer mark MXn is subjected to averaging processing to reduce the deterioration in the detection accuracy. However, since the forbidden bands (SA1, SA3) on the wafer are areas which reduce the effective usable area on the wafer W, there is a limitation on the ground that these prohibit zones should preferably be as small as possible. Therefore, each of the index marks cannot be composed of many patterns with the result that there is the danger of the averaging effect being deteriorated and the signal waveform portions corresponding to the index marks 30a and 30b being predominated by the noise components due to the effect of the optical characteristics of the wafer surface. As a result, there is caused a problem that the detection accuracy of the index marks 30a and 30b is deteriorated and hence the position detection accuracy of the wafer mark MXn is deteriorated. Also, since the vicinity of the wafer mark MXn on the wafer must be defined as the forbidden bands corresponding to the index marks, there is the disadvantage that the mark area SA (including the wafer mark MXn and the forbidden bands) on the wafer is inevitably increased (the effective usable area of the wafer is decreased).

SUMMARY OF THE INVENTION

It is the primary object of the present invention to attain an excellent position detection accuracy even in cases where the surface of a wafer is not smooth and to reduce the mark area (to increase the effective area of the wafer) on the wafer.

It is another object of the present invention to ensure that the index marks and the wafer marks are illuminated separately.

In accordance with one aspect of the present invention, there is thus provided an apparatus for detecting a first mark formed on a substrate and subject to position detection by an image pickup device through an objective optical system to detect the position of the first mark in accordance with a video signal from the image pickup device, and the apparatus includes an index plate arranged at a position substantially conjugate to the substrate with respect to the objective optical system and formed with a second mark of a given shape, an imaging system for connecting the index plate and the image pickup device in an optically conjugate relation, first illumination means for illuminating at least partially a first area on the index plate containing the second mark, second illumination means for illuminating through the objective optical system a localized area on the substrate corresponding at least to a second area other than the first area on the index plate and said image pickup device being adapted to generate the video signal corresponding to the images of the first and second marks formed in the image pickup device when the first mark is positioned within the localized area on the substrate illuminated by the second illumination means.

Further, in accordance with another aspect of the present invention, the apparatus further includes light quantity adjusting means for adjusting the quantity of the illuminating light from at least one of the first and second illumination means.

In accordance with the present invention, the specified area containing the second mark on the index plate is illuminated independently by the first illumination means and therefore the detection of the second mark does not suffer any detrimental effect due to the reflected light from the surface of the substrate. As a result, even if the substrate surface is rough, the detection accuracy of the index mark is not deteriorated and it is possible to ensure excellent detection accuracy and hence accurate alignment.

Further, since the images of the respective marks are formed on the detection surface of the image pickup device by the separate illumination means, the contrast of the individual images can be adjusted separately. Thus, the individual images can be detected while maintaining them in the clear condition and thus the detection accuracy is improved further.

The above and other objects, features and advantages of the present invention will become more apparent from the following description of its preferred embodiments intended for no limitation when taken in conjunction with the accompanying drawings.

BRIEF DESCRIPTION OF THE DRAWINGS

FIG. 19A is a schematic diagram showing the manner in which the marks are detected by the image pickup device in the conventional position detecting system.

FIG. 19B is a waveform diagram showing the signal waveform generated from the image pickup device in correspondence to FIG. 19A.

FIG. 20 is a waveform diagram showing the signal waveform generated from the image pickup device of the conventional position detecting system when the wafer surface is rough.

DESCRIPTION OF THE PREFERRED EMBODIMENTS

Figure 1:
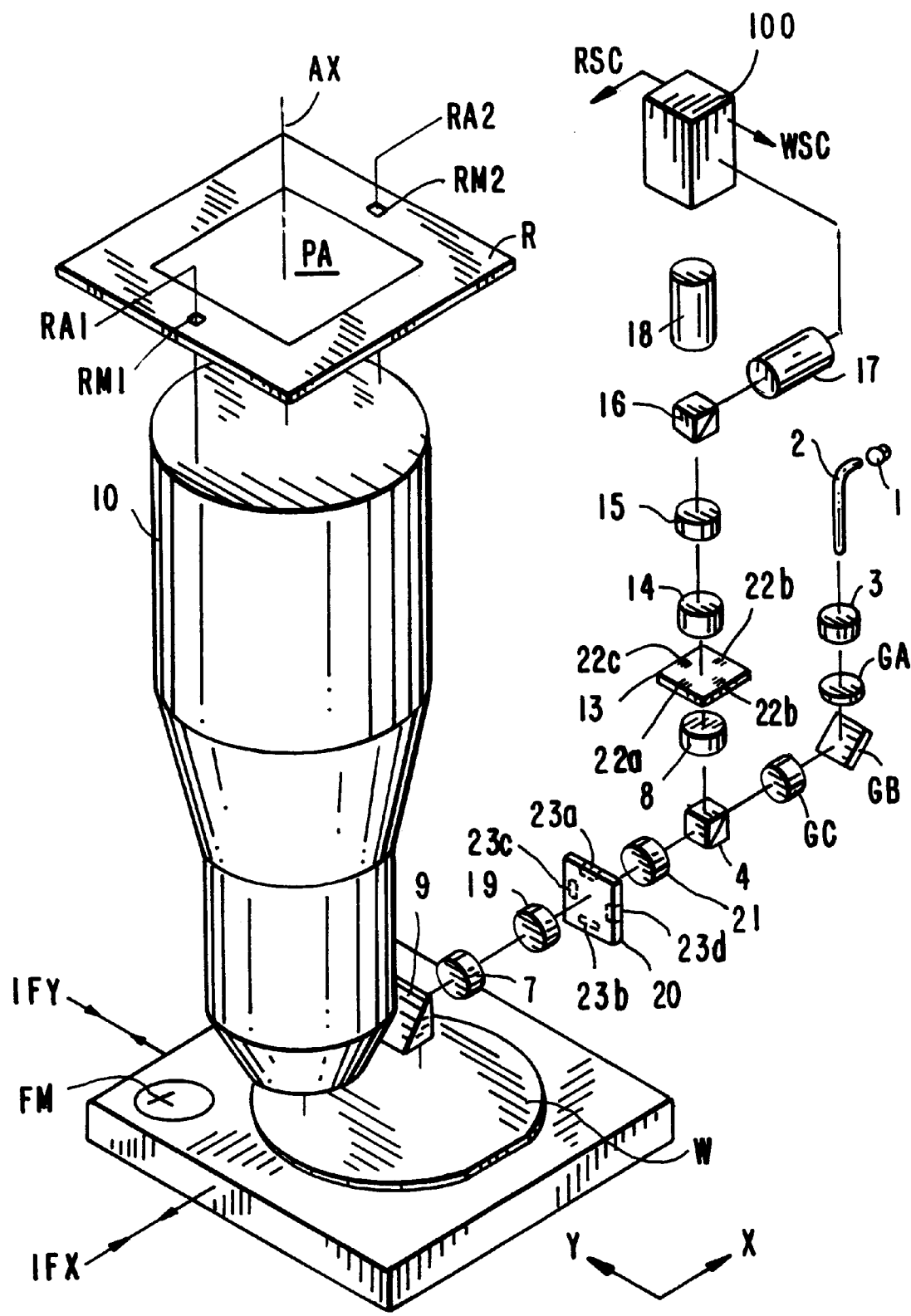
FIG. 1 is a schematic diagram showing the construction of the principal parts of a projection exposure apparatus equipped with a position detecting apparatus according to an embodiment of the present invention.

The construction of a projection exposure apparatus equipped with a position detecting apparatus according to an embodiment of the present invention will be described first with reference to FIG. 1. In the Figure, an image of the pattern area PA on a reticle R is projected and focused on the corresponding shot area on a wafer W through a projection lens 10. The wafer W is loaded on a stage 5 movable in the X and Y directions in a step-and-repeat manner and the coordinate position of the stage 5 is measured by laser interferometers IFX and IFY. By positioning reticle alignment marks RM1 and RM2 formed on the sides of the pattern area PA with respect to reticle alignment microscopes RA1 and RA2, the reticle R is aligned with the apparatus (the optical axis AX of the projection lens 10).

Then, the apparatus according to the present embodiment is applied to a wafer alignment sensor which detects wafer marks MXn and MYn on the wafer W by the off-axis method. This wafer alignment sensor is composed of a prism-like mirror 9 arranged in close proximity to the lower part of the projection lens 10, an objective lens 7, relay lenses 19 and 21, a pattern plate 20, an imaging lens 8, a conjugate index plate 13, an image pickup lenses 14 and 15, a half mirror 16 and CCD two-dimensional image pickup devices 17 and 18, etc.

Also, in order to illuminate the mark areas on the wafer W, there is provided an illumination optical system including a light source 1 such as a halogen lamp, a high-brightness multiple-color LED or the like for illuminating the mark areas on the wafer W, an optical fiber bundle 2 for directing the light of a wide band of wavelengths (the sensitizing region for the wafer W is cut off) from the light source 1, a condenser lens 3, an illumination field stop GA, a full-reflection mirror GB, a lense system GC and a half mirror 4.

Figure 2A:
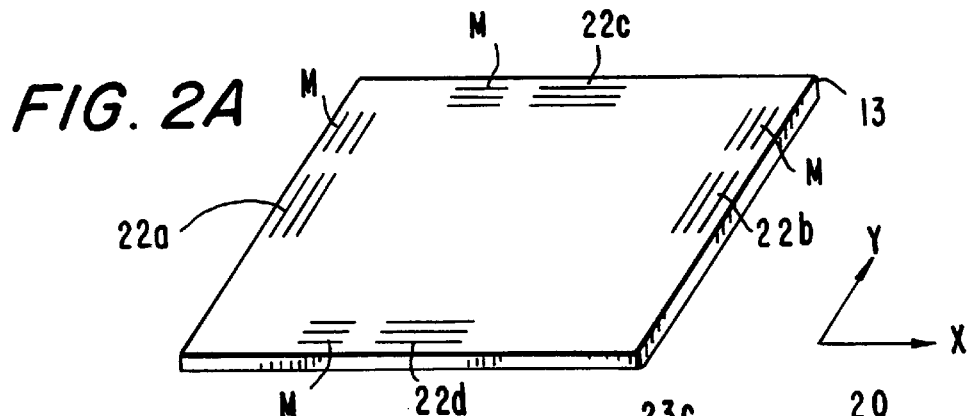
FIGS. 2A and 2B are perspective views showing respectively the arrangement of the reflecting sections on the pattern plate and the arrangement of the index marks on the index plate in the embodiment of the present invention.
Figure 2B:
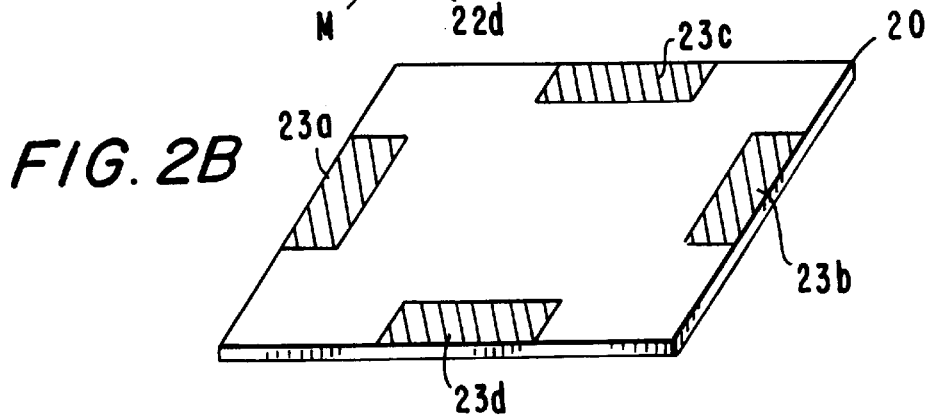

With the construction described above, the pattern plate 20, the index plate 13 and the image pickup surfaces of the CCD camera 17 and 18 are arranged in practically conjugate positional relation with the wafer W. A plurality of index marks 22a, 22b, 22c and 22d are formed on the index plate 13 as shown in FIG. 2A, and also the pattern plate 20 is formed with reflecting sections 23a, 23b, 23c and 23d at those positions respectively corresponding to the index marks 22a to 22d as shown in FIG. 2B. These index marks and the reflecting sections will be described later. Then, the CCD cameras 17 and 18 simultaneously pick up the images of the wafer marks MXn and MYn on the wafer W, the images of the index marks 22a to 22d on the index plate 13 and the images of the reflecting sections 23a to 23d on the pattern plate 20.

Also, in the illumination optical system the exit end face of the optical fiber bundle 2 is relayed as a secondary light source image to the pupil plane (the position of the aperture stop) between the objective lens 7 and the lens system GC thereby subjecting the wafer W to the Köhler's illumination. In addition, the field stop GA is made conjugate to the wafer W through a combination system of the objective lens 7 and the lens system GC so that the aperture image of the field stop GA is projected onto the wafer W. It is to be noted that in the present embodiment at least the objective lens 7, the image pickup lens 15 are made achromatic thereby preventing deterioration of their imaging characteristics by the chromatic aberrations.

Then, the return light beams from the wafer marks MXn and MYn on the wafer W are returned through the same light path, reflected by the half mirror 4 and projected onto the index plate 13 by the imaging lens 8. The light beams transmitted through the index plate 13 are passed through the image pickup lenses 14 and 15, separated by the half mirror 16 and projected again onto the X-axis alignment CCD camera 17 and the Y-axis alignment CCD camera 18, respectively. Thus, the mark images of the wafer marks MXn and MYn are respectively projected onto the CCD cameras 17 and 18. However, it is assumed that the CCD cameras 17 and 18 are arranged in such a manner that their horizontal scanning directions cross each other at right angles.

With the above-described optical system for mark detecting purposes, the numerical aperture (N.A.) of the optical system up to the CCD camera 17 is selected small so as to increase the focal depth and make the processing of the signal waveform easy. Also, in order to reduce the effect of the rough surface portions of the wafer W, that is, in order to reduce the noise signal components from the rough wafer surface portions due to grains, etc., and thereby to detect the signals from the mark edge portions satisfactorily, the coherent factor or the σ value of the illumination system is increased. This σ value should preferably be on the order of 0.8 to 1.0 or alternatively it may be made variable depending on the edge step or shape of the marks or the degree of roughness of the wafer surface.

The detection of a low-stepped mark will be described by way of example. In this case, if the σ value is excessively large, it is no longer possible to satisfactorily detect the mark itself. Therefore, it is necessary to adjust the σ value to become about 0.8, for example, thereby reducing the noise components from the rough wafer surface portions and also it is necessary to arrange so that such a low-stepped mark can be detected satisfactorily. It is to be noted that the range of variations of the σ value is not limited to 0.8 to 1.0 and it is determined in dependence on the mark and the surface roughness of the wafer. In addition, the illuminating light quantity is adjusted in accordance with the wafer.

On the other hand, in the apparatus of the present embodiment a fiducial mark FM is provided on the stage 5 and this fiducial mark FM is used for the measurement of the distances (base lines) among the projection points on the wafer W of the index marks on the index plate 13 included in the wafer alignment sensor and the projection points on the wafer W of the reticle alignment marks RM1 and RM2 on the reticle R. Also, a main control system 100 collectively controls the apparatus on the whole and the control of the stage 5 is effected through a stage controller 52.

Figure 3:
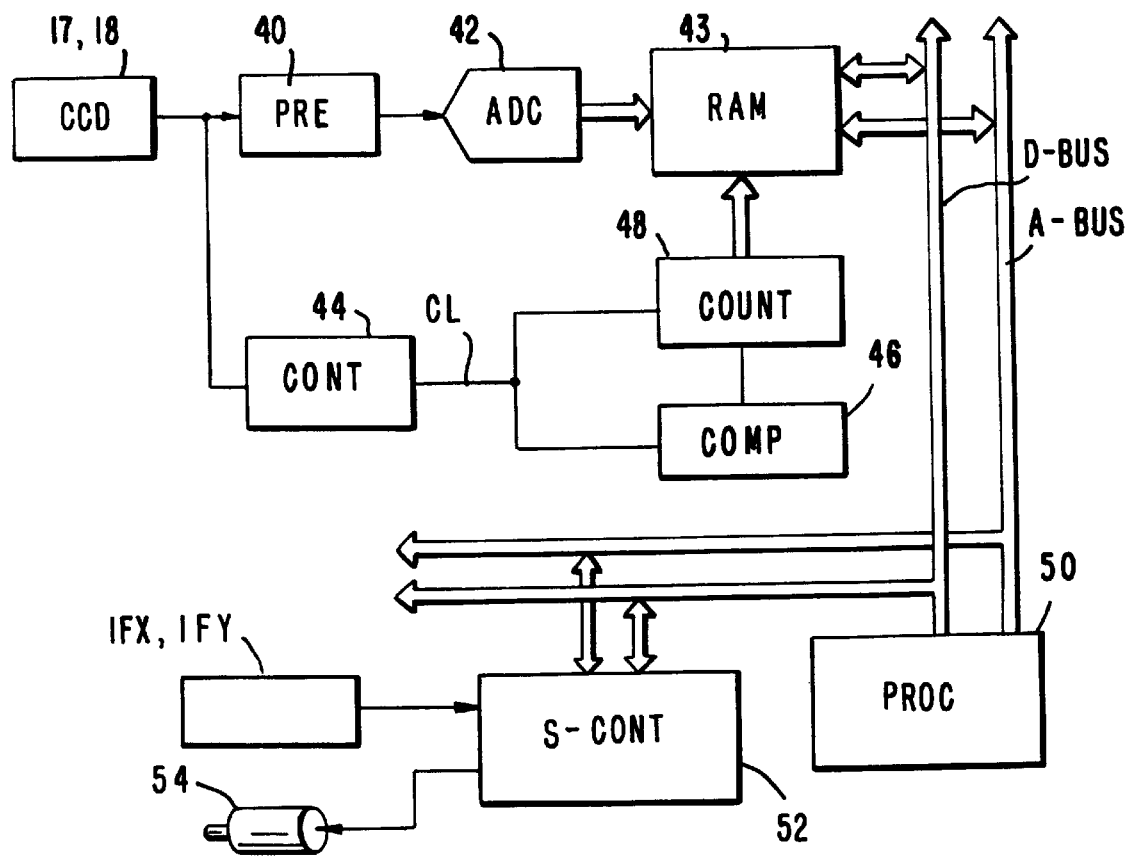
FIG. 3 is a block diagram showing the processing of the image signals from the CCD camera in the embodiment of the present invention.

Referring now to FIG. 3, a processing circuit for the video signals from the CCD cameras 17 and 18 will be described.

While the CCD cameras 17 and 18 are each composed of a two-dimensional image pickup device whose pixels are arranged in the horizontal and vertical scanning directions, it is assumed in the present embodiment the direction traversing the edges of the marks on the wafer W is in coincidence with the horizontal scanning direction of each of the CCD cameras 17 and 18.

Now, each of the CCD camera 17 and 18 generates a composite video signal mixed with horizontal and vertical sync signals. This video signal is sent to an analog-digital converter (ADC) 42 through a preprocessing circuit (PRE) 40 composed for example of a frequency filter or AGC. On the other hand, the video signal from the CCD camera 17 or 18 is also sent to a control circuit (CONT) 44 including a sync signal separating circuit, a clock generating circuit, etc., so that in accordance with the horizontal sync signal from the CCD camera 17 or 18, the control circuit 44 generates clock signals CL consisting of one clock pulse per electric scanning (reading scanning) of one pixel. The clock signals CL are sent to a comparator (COMP) 46 for determining whether the electric scanning of the CCD camera 17 or 18 has attained the sampling range (the number of the horizontal scanning lines in the vertical direction) and to an address counter (COUNT) 48 for applying address values to a memory (RAM) 43 which stores the output data of the ADC 42. Therefore, the RAM 43 stores therein digital waveform data for the specified number of the horizontal scanning lines from the given one of the CCD cameras 17 or 18. The waveform data within the RAM 43 is read into a processor 50 through an address bus A-BUS and a data-bus D-BUS which are controlled by the processor 50, thereby performing the desired waveform processing operation. The main control system 100 (FIG. 1) is constructed by the foregoing components. Then, the stage controller (S-CONT) 52 is connected to the address bus A-BUS and the data bus D-BUS of the processor 50 and the controller 52 receives the coordinate measured values of the interferometers IFX and IFY to control a drive motor 54 for the stage ST.

The main control system 100 shown as mark position detecting means in FIG. 1 includes the component parts 40 to 50 shown in FIG. 3 so that in FIG. 1 symbol WSC designates control signals for the controller 52 and they correspond to the A-BUS and D-BUS of FIG. 3. Also, in FIG. 1 symbol RSC designates bus lines for controlling a reticle stage which is not shown.

Figure 4:
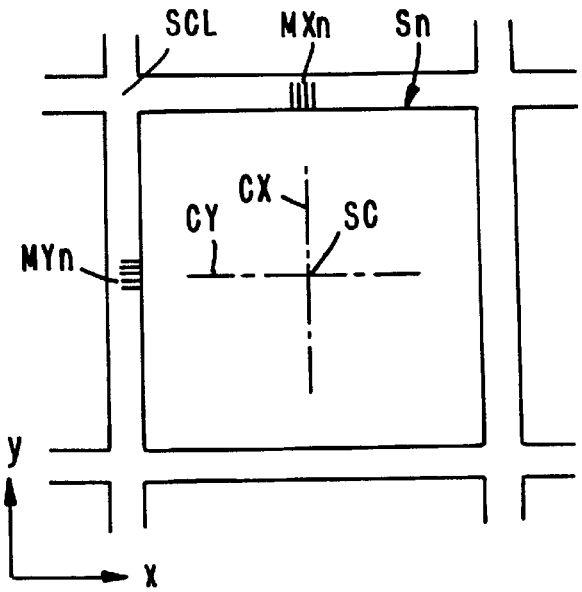
FIG. 4 is a schematic diagram showing the arrangement of the shot areas and the alignment marks on the wafer in the embodiment of the present invention.

Referring now to FIG. 4, there is illustrated a schematic diagram showing the relation between a given shot area Sn on the wafer W and the alignment marks MXn and MYn on the wafer W, and the four sides of the shot area Sn are enclosed by scribe lines SCL. The marks MXn and MYn are respectively formed on the central portions of the two scribe lines SCL which cross each other at right angles. Here, symbol SC designates the central point of the shot area Sn and the optical axis AX of the projection lens PL passes through it during the exposure. Then, the marks MXn and MYn are respectively positioned on lines CX and CY which are respectively extended in the X and Y directions with the center SC as the origin.

The thus formed mark MXn is used for the X-direction position detecting purposes and it comprises multiple patterns in grating form including five line patterns P1, P2, P3, P4 and P5 which are extended in the Y direction and arranged at substantially a constant pitch P (the duty ratio of 1:1) in the X direction. Also, this is the same with the mark MYn used for Y-direction position detecting purposes and it comprises multiple patterns in grating form including line patterns which are extended in the X direction and arranged at substantially a constant pitch P in the Y direction.

Referring now to FIG. 2A, there is illustrated an exemplary arrangement of the index marks (22a, 22b) (22c, 22d) on the conjugate index plate 13 and the index marks 22a to 22d are each composed of three fine lines made for example from a film of vapor-deposited chromium on a transparent glass sheet. The index marks 22a and 22b are arranged side by side in the X direction and the index marks 22c and 22d are arranged side by side in the Y direction. In the case of X-direction alignment, the stage is actuated to produce a condition in which the mark MXn is inserted between the index marks 22a and 22b within the CCD image and then the position detection is effected. Similarly, during the Y-direction alignment, a condition is produced in which the mark MYn is inserted between the index marks 22c and 22d and then the position detection is effected.

The illumination of the index plate 13 will now be explained. In the like manner as the previously mentioned illumination of the wafer W, the illuminating light from the light source 1 such as a halogen lamp is irradiated on the pattern plate 20 shown in FIG. 2B. The pattern plate 20 is composed of a flat plate of a light transmitting material such as glass and it includes the reflecting sections 23a to 23d. The reflecting sections 23a to 23d are formed through the evaporation of chromium or the like on a glass surface and they are arranged at the corresponding positions (the conjugate positions) to the index marks 22a to 22d on the index plate 13. As a result, the illuminating light from the light source 1 is reflected by the reflecting sections 23a to 23d so that the reflected beams reach the index plate 13 through the half mirror 4 and the imaging lens 8 as in the case of the return light from the wafer W. The reflecting sections 23a to 23d are arranged in such a manner that illumination spots of a uniform illuminance distribution are produced on the given areas including the index marks 22a to 22d and also the return light from the wafer W is not prevented from passing through the other area than the given areas. As a result, the reflected light beams from the reflecting sections 23a to 23d transmit through and illuminate the index marks 22a to 22d on the index plate 13 independently of the return light from the wafer W.

The reflected light beams illuminated the index marks 22a to 22d are transmitted through the index marks 22a to 22d, reach the half mirror 16 through the lenses 14 and 15 and are projected again by the half mirror 16 onto the X-axis alignment CCD camera 17 and the Y-axis alignment CCD camera 18, respectively. Thus, the mark images of the index marks 22a to 22d are projected onto the CCD devices 17 and 18, respectively. It is to be noted that the reflecting sections 23a to 23d are only required to reflect the illuminating light and they are not limited to those made of a film of vapor-deposited chromium.

Figure 5A:
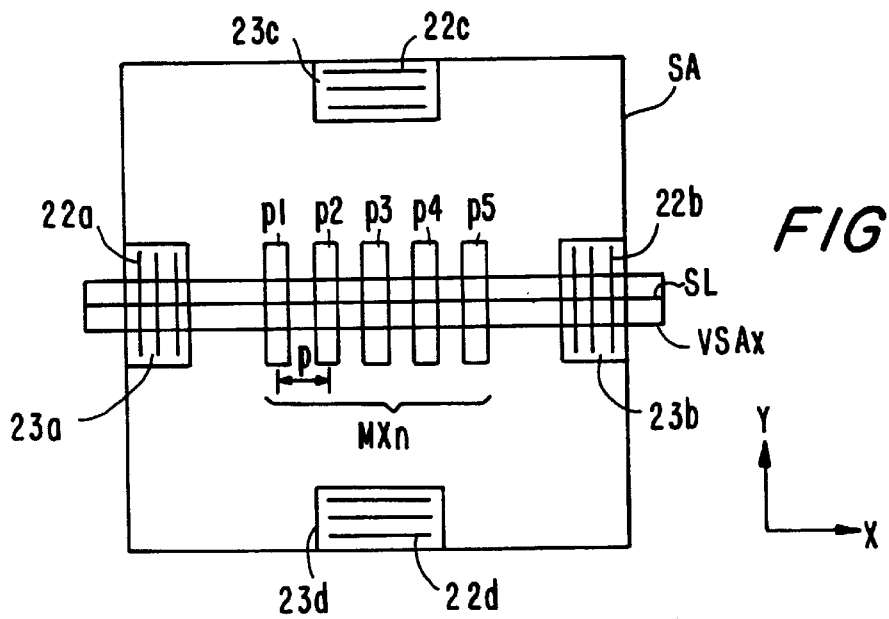
FIG. 5A is a schematic diagram showing the manner in which the marks are detected by the CCD camera in the embodiment of the present invention.
Figure 5B:
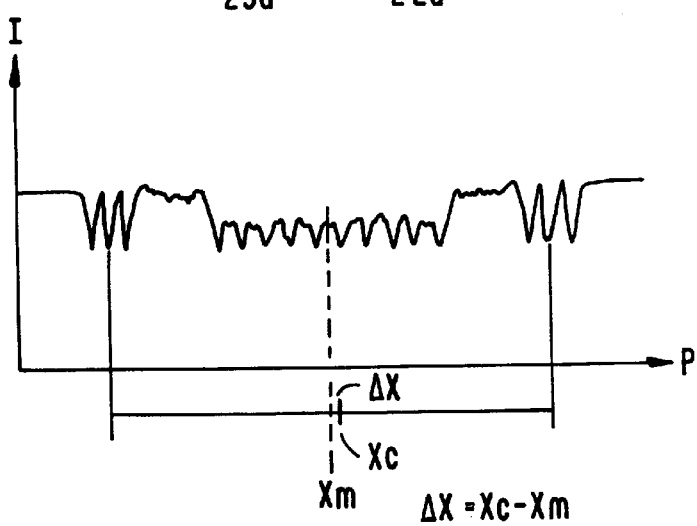
FIG. 5B is a waveform diagram showing the signal waveform generated from the CCD camera in correspondence to FIG. 5A.

Now showing an example of the thus produced video signal waveform, FIG. 5A is a waveform diagram showing the condition in which the wafer mark MXn is inserted between the index marks 22a and 22b within the image and here a situation is assumed in which the center Xm of the wafer mark MXn deviates slightly from the center Xc between the index marks 22a and 22b. FIG. 5B shows the waveform of the resulting video signal. In the Figure, the ordinate represents the video signal intensity I and the abscissa represents the scanning position P of the stage 5. In this condition, the amount of deviation $\Delta X$ between the centers Xm and Xc is calculated by the main control system 100. In this case, as shown in FIG. 5A, the stage 5 is positioned in such a manner that the mark MXn to be detected is positioned between the index marks 22a and 22b of the index plate 13 and the information of the then current precise position XA of the wafer stage 5 is stored in the RAM 43 of the main control system 100.

Then, the CCD camera 17 electrically scans the images of the five line patterns P1 to P5 of the mark MXn and the index marks 22a and 22b along a horizontal scanning line SL. Thus, as shown in FIG. 5B, the resulting video signal waveform along the horizontal scanning line SL by the CCD camera 17 is such that the interference phenomena due to the resist layer are reduced by use of the wide-band illuminating light and it attains the bottom (minimum value) only at each of the edge positions of the patterns P1 to P5.

In FIG. 5B, the index marks 22a and 22b are each composed of three fine bar marks and therefore the bottom waveform is obtained for every bar mark. Thus, a total of ten bottom waveforms are obtained at the respective edge positions of the wafer mark MXn (the multiple patterns P1 to P5).

The processor 50 temporarily reads this original signal waveform into the RAM 43. At this time, since the use of the single scanning line, for example, is disadvantageous from the standpoint of S/N ratio, the processor 50 produces average waveform data by adding and averaging for every pixel in the horizontal direction the levels of the image signal obtained by the plurality of horizontal scanning lines contained within the video sampling area VSAx as mentioned previously. The processor 50 performs a smoothing operation on this average waveform data. This smoothing is effected by passing the average waveform data through a numerical filter.

Then, the processor 50 binarizes or converts the average waveform data by pixel into binary coded form at a suitable slice level so that the center position Xc between the index marks 22a and 22b and the X-direction center position Xm of the mark MXn (the patterns P1 to P5) are calculated from the scanning direction (the X-direction) center of the binary coded waveform. In this case, the slice level is obtained for every signal portion corresponding to each of the edges and the respective sampling points for the waveform processing correspond not only to the horizontal pixel addresses of the CCD camera but also to the addresses of the RAM 43 individually.

In this case, since the index marks 22a to 22d of the index plate are illuminated independently of the return light from the wafer W, the signal waveforms for the index marks 22a and 22b are always stable and excellent (the contrast is constant). As a result, the index mark positions can be detected with a high degree of accuracy. Also, as regards the signal from the wafer mark MXn, the effect of the noise components due to the surface roughness of the wafer W is reduced by the averaging process. In other words, while generally the detection accuracy of the wafer mark is deteriorated if the wafer surface is not smooth, in accordance with the present embodiment there is no need to provide on the wafer the portions corresponding to the forbidden bands (SA1, SA3) mentioned previously in connection with FIG. 19A so that if these portions are also utilized as the mark areas, the averaging effect of the signal due for example to the multiple patterns is increased and hence the detection accuracy can be improved. Further, in accordance with this embodiment the index marks are illuminated separately as mentioned previously thereby eliminating the need to provide such portions corresponding to the forbidden bands on the wafer and therefore the mark areas on the surface of the wafer W can be substantially limited in space. As a result, there is the advantage of increasing the effective usable area of the wafer surface correspondingly.

Then, the processor 50 calculates the difference a ΔX=Xc−Xm between the positions Xc and Xm and the value obtained by adding together the position XA obtained by the previously mentioned positioning of the stage 5 and the difference ΔX is calculated as mark position information (alignment information). Further, in accordance with this mark position information the stage controller 52 controls the motor 54 and the stage 5 is moved to a given position thereby effecting the accurate alignment.

On the other hand, also with regard to the mark MYn, similarly the stage 5 is temporarily positioned in such a manner that the mark MYn is inserted between the index marks 22c and 22d within the image and the processor 50 calculates the difference ΔY between the center position Yc between the index marks 22c and 22d and the center position Ym of the mark MYn and mark position information, thereby controlling the movement of the stage 5. Here, while the two index mark groups for the X and Y directions are formed on the index plate and the imaging light beams from these groups are sensed by the CCD cameras 17 and 18, respectively, X-direction and Y-direction alignment optical systems may be separately arranged from the objective lens and the index plate 13 and the pattern plate 20 may each be separated into two X-direction and Y-direction units.

On the other hand, if the line width and space width of the marks are decreased with a view to ensuring a high contrast, the marks exceed the limit of the resolution and the contrast is deteriorated. On the contrary, if both the line width and the space width are increased, the marks are increased in size and the averaging effect is decreased. Thus, as shown in FIG. 6A, the patterns having a different line-space duty ratio without any change of the mark pitch may be applied to each of the marks MXn and MYn.

In the case of the previously mentioned patterns of the 1:1 duty ratio shown in FIG. 5A, the leading and falling edges of each of the lines in the mark are detected as dark portions and therefore two signals are generated from each mark element (line) as shown in FIG. 5B. However, if, while maintaining the duty ratio of 1:1 as such, the line width and the space width are decreased to reduce the line portions and the space portions of the mark to a width dimension which is less than the resolution limitation, the detection signals from the edges of each line portion appears as a single superposed bottom waveform on the signal waveform. Therefore, if the line-space duty ratio is changed in such a manner that "the line width<space width" without changing the pitch of the mark pattern, a signal is produced which forms one bottom waveform for every bar mark element as shown in FIG. 6B and thus a high-contrast mark signal is produced.

Figure 6A:
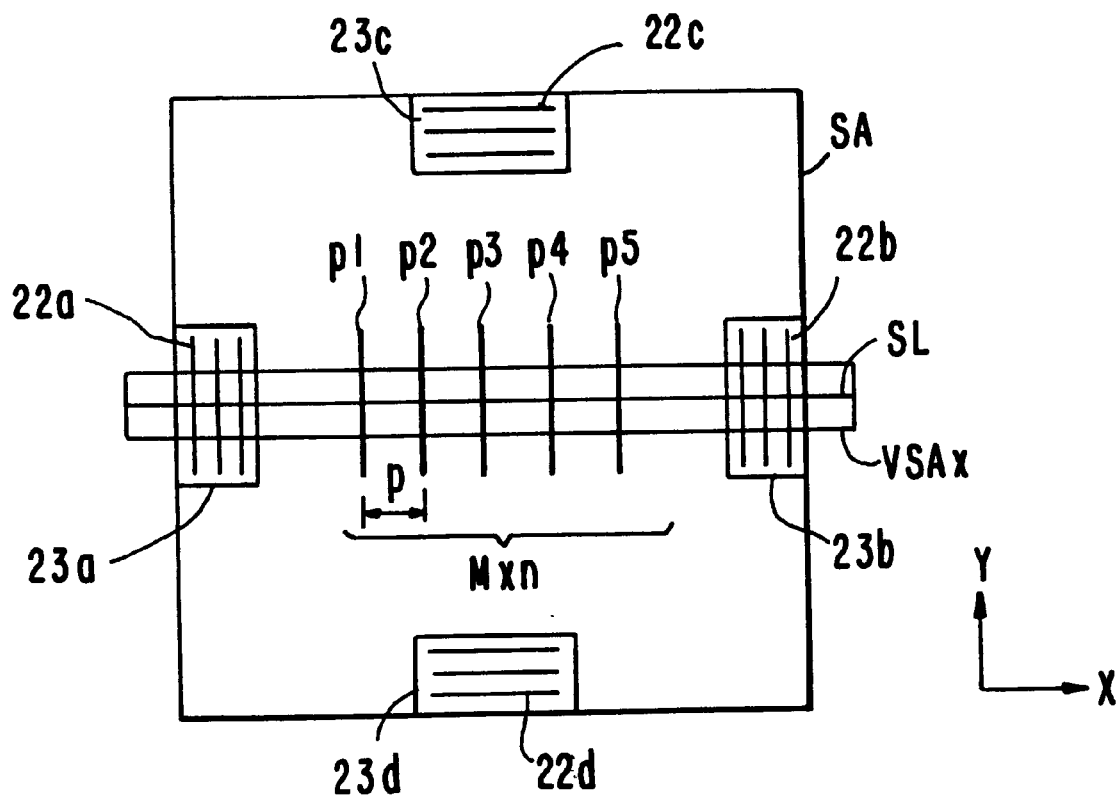
FIG. 6A is a schematic diagram showing the manner in which the marks are detected by the CCD camera in a modified embodiment of the present invention.
Figure 6B:
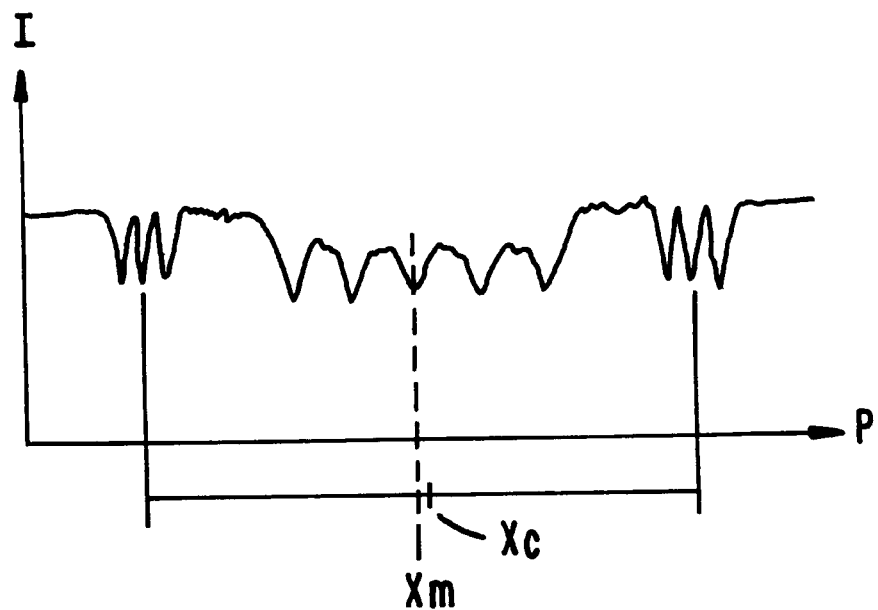
FIG. 6B is a waveform diagram showing the signal waveform generated from the CCD camera in correspondence to FIG. 6A.

It is to be noted that the mark patterns of FIG. 6A show the case where the duty ratio (line width:space width) is 1:3 and that in FIG. 6B the ordinate represents the video signal intensity I and the abscissa represents the scanning position P of the stage 5.

Figure 7A:
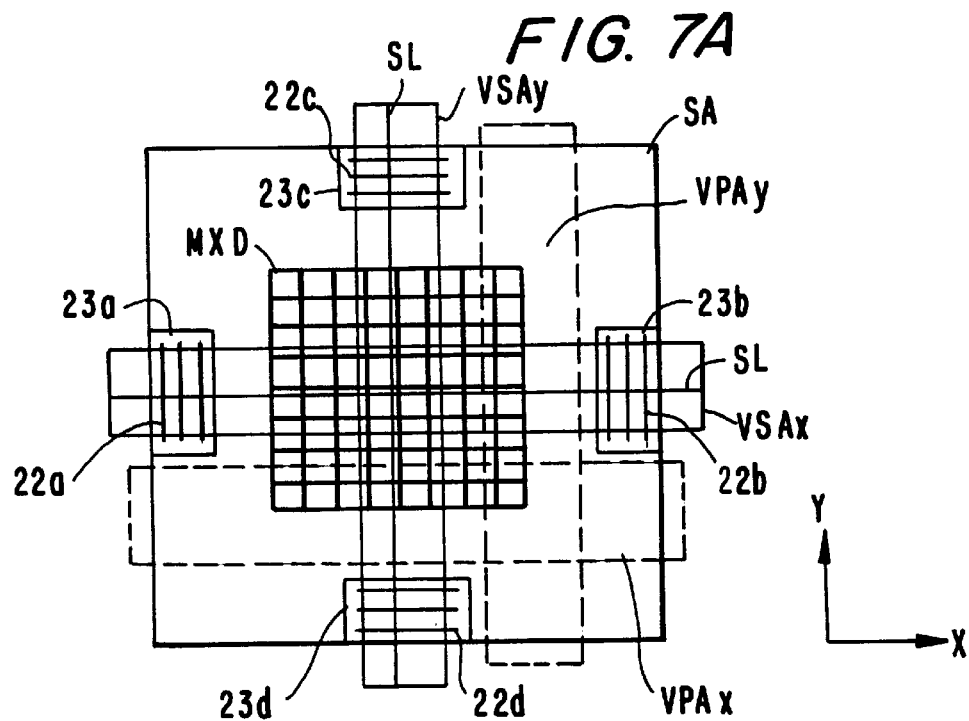
FIG. 7A is a schematic diagram showing the manner in which the marks are detected by the CCD camera in another modified embodiment of the present invention.
Figure 7B:
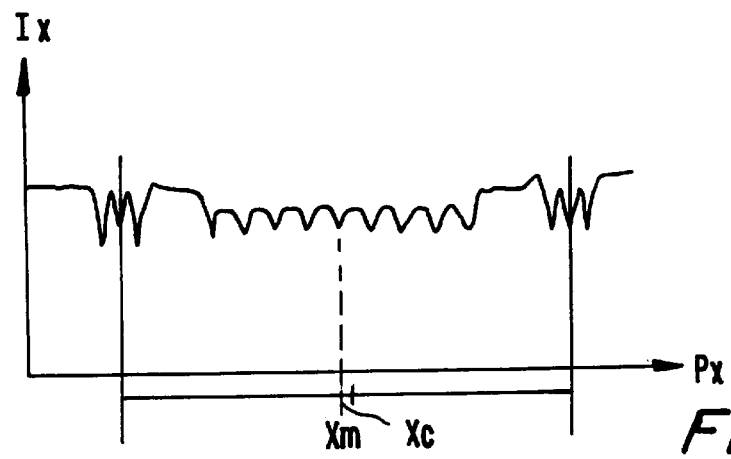
FIG. 7B is a waveform diagram showing the X-direction signal waveform generated from the CCD camera in correspondence to FIG. 7A.
Figure 7C:
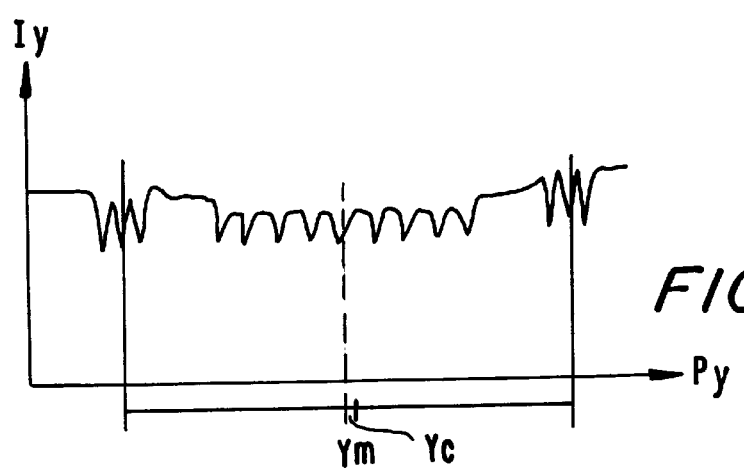
FIG. 7C is a waveform diagram shwoing the Y-direction signal waveform generated from the CCD camera in correspondence to FIG. 7A.

Also, while, in FIG. 6A, the ordinary alignment marks provided separately for the X and Y axes are used as the wafer marks, they may be replaced with a checkered XY common mark MXD shown in FIG. 7 may be used. In this case, by arranging so that the index marks and the wafer marks can be simultaneously measured in the image pickup area VSAx of the CCD camera 17 and the image pickup area VSAy of the CCD camera 18 with respect to the X direction and the Y direction, respectively, it is possible to improve the throughput. Thus, by forming the XY common wafer mark MXD shown in FIG. 7 with the patterns of a small duty ratio as shown in FIG. 6A, there is the advantage of reducing the exclusive mark area on the wafer as compared with the case of forming the XY common mark with the multiple patterns comprising the wide-width mark elements having the duty ratio of 1:1 as shown in FIG. 5A. FIGS. 7B and 7C respectively show the signal waveforms generated from the CCD cameras 17 and 18 in the condition shown in FIG. 7A. In each of FIGS. 7B and 7C, the ordinate represents the video signal intensity I and the abscissa represents the scanning position P of the stage 5.

A description will now be made of the case where the off-axis type wafer alignment sensor shown in FIG. 1 is used for the purpose of enhanced global alignment. The enhanced global alignment is an alignment technique employing a statistic operational processing based on the least square approximation and its details are disclosed in U.S. Pat. No. 4,780,617. Thus, any description of its detailed calculations will be omitted.

Assume now that as for example, the XY common wafer alignment mark MXD shown in FIG. 7A is used in such a manner that the mark is formed on each of the right and left sides or the top and bottom sides of each of the chips on a wafer and the mark detection for the enhanced global alignment is effected with respect to the X and Y directions by the method disclosed in U.S. Pat. No. 4,780,617. In this case, the resulting offset of the lateral or vertical Y-axis alignment is a rotational error of the wafer or the chip and the offset of the lateral or vertical X-axis alignment is a magnification error of the wafer or chip.

Figure 8:
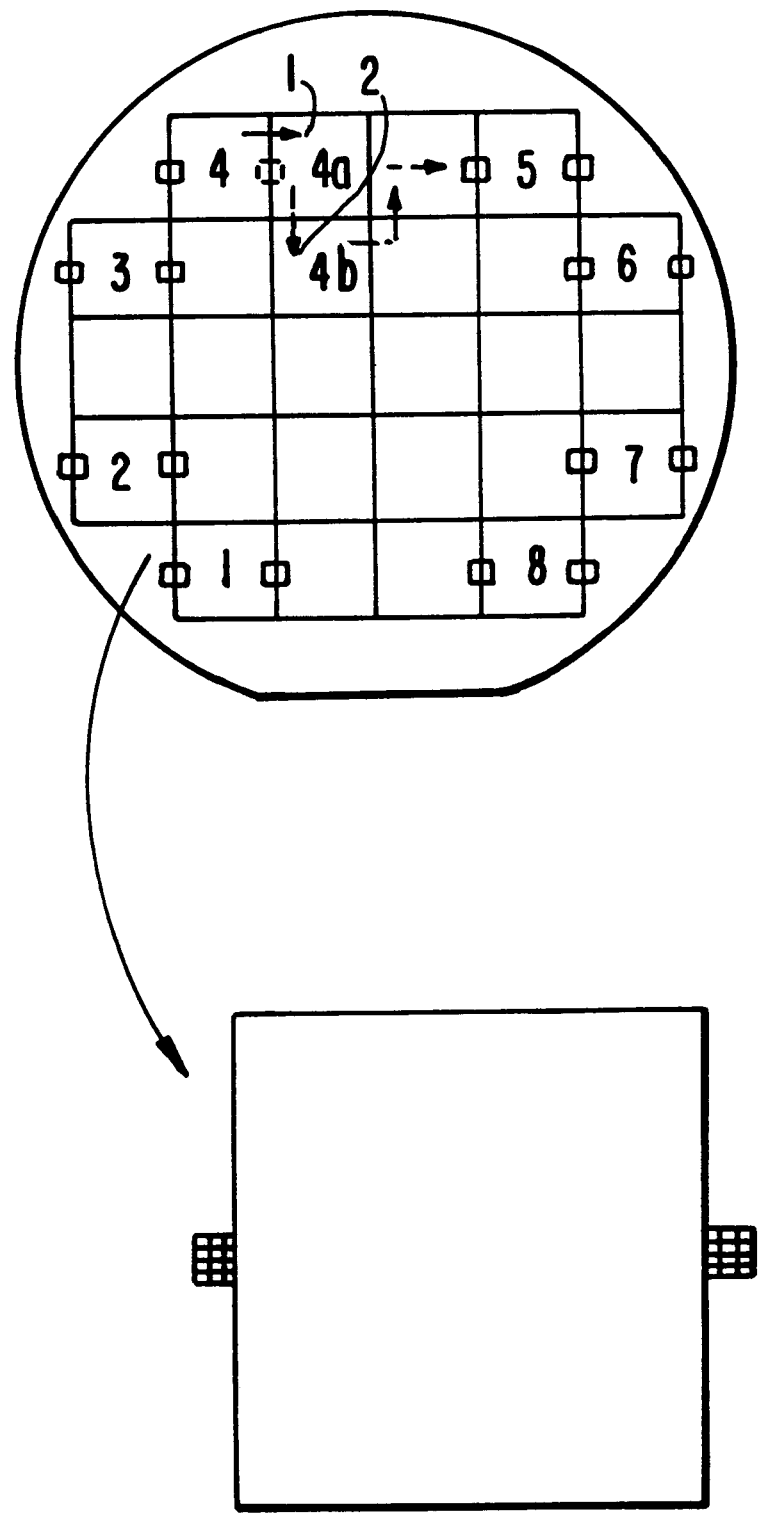
FIG. 8 shows the arrangement of the shot areas on the wafer which are subject to sample alignment in the embodiment of the present invention and the alignment marks in enlarged form which are formed around one of the shot areas.

Thus, in this way the alignment can be effected with a high degree of accuracy while compensating the chip rotation and the chip magnification. Further, by performing the enhanced global alignment by using the alignment marks formed at two locations around the chip, the averaging effect on the alignment measuring accuracy is increased by two times than previously, thereby greatly improving the alignment accuracy. Note that here the description is made by taking the case of using the No. 1 to No. 8 shot areas of FIG. 8 to perform the enhanced global alignment for the wafer.

When detecting the wafer mark for the purpose of performing the enhanced global alignment, there are cases where due to for example the deformation of the wafer mark caused by the effect of the wafer processing, the mark cannot be detected satisfactorily depending on the shot area. In such a case, it is suffice to perform a substitution processing using the mark of the other shot area. As an example, a description will be made of a case where importance is attached to the throughput. Where the No. 1 to No. 8 shot areas are to be measured in this order, assume that the mark of the No. 4 shot area, for example, is not detected satisfactorily. In this case, of the other shot areas on the vector directed toward the No. 5 shot area from the No. 4 shot area, it is suffice to measure the mark (at ① in FIG. 8) of the No. 4a shot area adjoining the No. 4 shot area.

Then, if the mark of the No. 4a shot area is not detected satisfactorily, too, of the shot areas on the vector crossing at a right angle the vector directed toward the No. 5 shot area from the No. 4 shot area, the mark (at ② in FIG. 8) of the shot area 4b adjoining the No. 4a shot area can be detected advantageously. This means that with the No. 5 shot area to be measured next being interposed, the shot areas on the opposite side to the No. 4 shot area should preferably be not selected.

By selecting the desired substitute shot area for the purpose of enhanced global alignment in accordance with the above-mentioned conditions, it is possible to ensure excellent mark detection while maintaining the maximum throughput. While the foregoing description has been made on the case where importance is attached to the throughput, the selection of such substitution shot is determined in accordance with the condition to be emphasized.

With the CCD camera, if the reflecting sections 23a to 23d of the pattern plate 20 are excessively bright with respect to the wafer surface, generally the intensity of the light beams from the index marks to be detected differs greatly from the light beams from the wafer mark to be detected and thus the AGC (automatic gain control) in the CCD unit comes into operation. As a result, there are cases where the detected light beams from the index marks are insufficient in contrast thus failing to detect the index marks.

In such a case, another index mark M should preferably be provided on the index plate 13 in addition to the index marks 22a to 22d which are respectively illuminated by the reflected light beams from the pattern plate 20 of the present embodiment. This additional index mark M is one which is illuminated by the reflected light from the wafer W as in the case of the conventional technique and the index mark M is arranged at a position other than the specified areas at the positions corresponding to the reflecting sections 23a to 23d within the illumination area of the index plate 13. Then, it is suffice to make the selection between the use of the index marks 22a to 22d and the use of the additional index mark M in accordance with the difference in reflectance between the wafer W and the pattern plate 20. As for example, if the AGC circuit comes into operation and the index marks 22a to 22d are not detectable, it is suffice that the processor 50 utilizes the detected light from the additional index mark M for this selection.

Next, a description will be made of the case where the off-axis type alignment sensor shown in FIG. 1 is used for the global alignment of a wafer W. While, in a stepper of this type, generally the orientation flat of the wafer is detected so that the wafer W is mechanically positioned (prealignment) and loaded on the stage 5, in this condition there is a prealignment error of about 20 μm to 100 μm. The so-called global alignment is the operation of searching the global alignment marks on the wafer in anticipation of such prealignment error and corresponding the actual arrangement of the shot areas on the wafer to the design arrangement of the shot areas within an error range of about ±1 μm.

Thus, where the global alignment is effected by use of the CCD camera, even if the stage 5 is positioned in accordance with the design values, there is the possibility of no global mark being present within the image pickup range of the CCD camera if the prealignment error is large. Thus, where the global alignment of the wafer W is effected by picking up the wafer surface by the CCD camera, it is necessary to perform a global search operation of observing the wafer surface by the CCD camera and shifting the wafer in uniform movements. For this purpose, use is made for example of the transparent areas VPAx and VPAy on the image pickup surfaces of the CCD cameras 17 and 18 shown in FIG. 7A. Since the areas VPAx and VPAy are respectively present at the predetermined positions on the image pickup surfaces of the CCD cameras 17 and 18, the positions and numbers of the scanning lines for scanning the areas VPAx and VPAy are preliminarily known.

Also, assuming that the global marks on the wafer are formed within the street lines SCL, each of the global marks is composed of three grating marks arranged in parallel along the longitudinal direction of the street line SCL. Here, it is assumed that when the stage 5 is initially positioned in accordance with the design values, the global mark is caught within the transparent areas VPAx and VPAy of the pattern plate 20. At this time, the processor 50 adds and averages the video signals corresponding to the plurality of scanning lines within the areas VPAx and VPAy and stores the resulting waveform data in the RAM 43.

Then, this initially stored waveform data is analysed so as to recognize whether it represents the global mark. As the algorithm of the recognition, the technique disclosed for example in U.S. Pat. No. 4,723,221 can be employed. In other words, the waveform position closest to the design arrangement relation of the global mark is searched.

Figure 9:
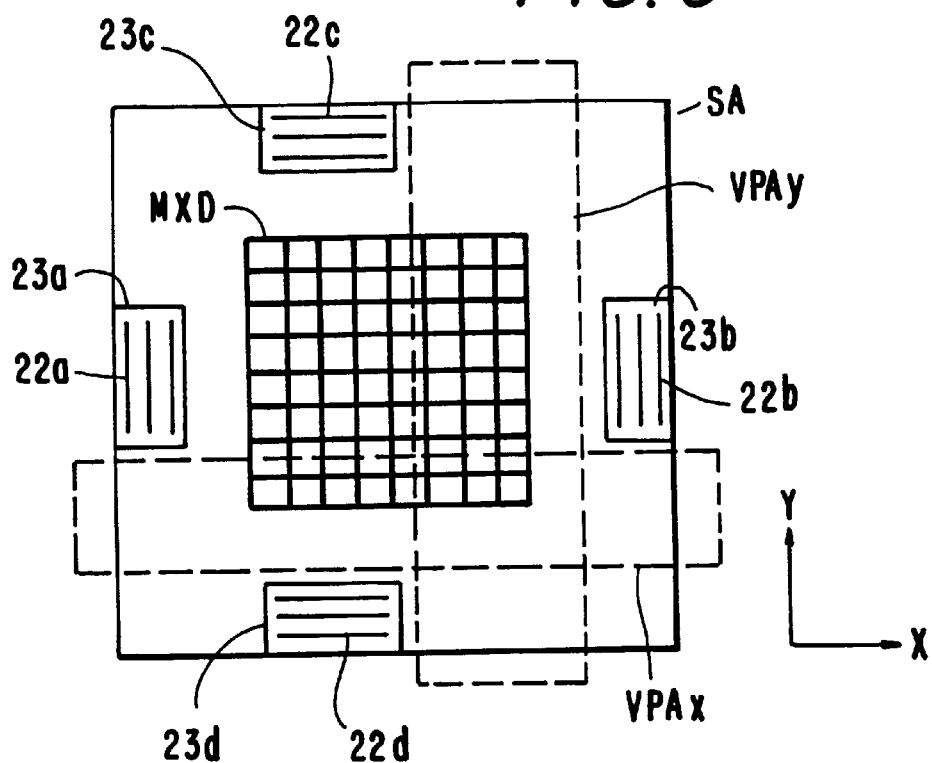
FIG. 9 is a schematic diagram showing the arrangement of the reflecting sections and the index marks in still another modified embodiment of the present invention.
Figure 10:
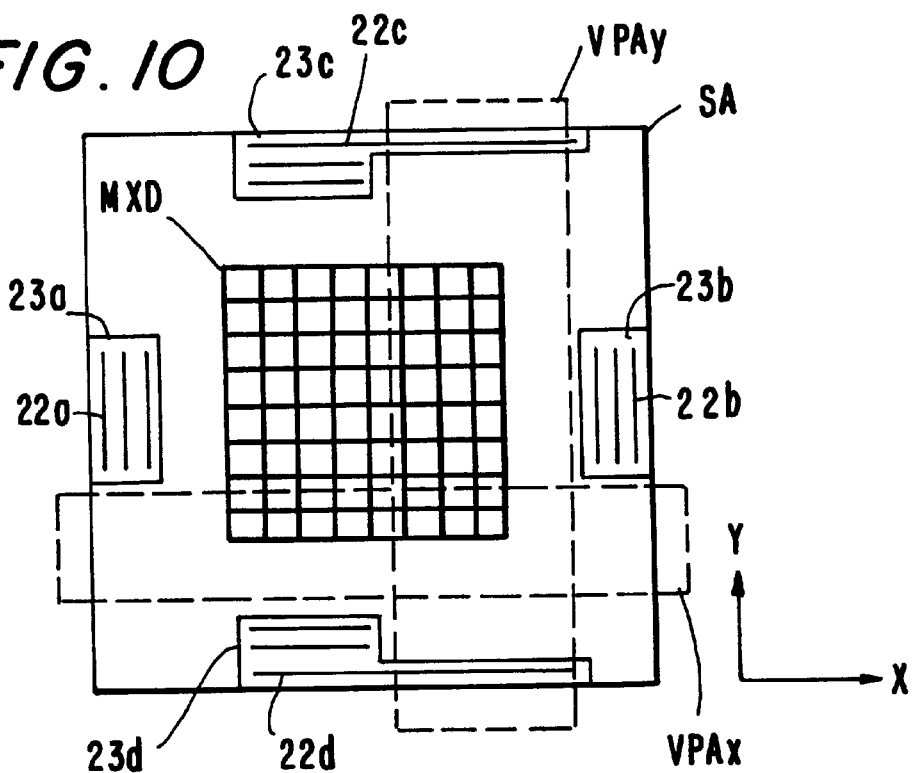
FIG. 10 is a schematic diagram showing the arrangement of the reflecting sections and the index marks in still another modified embodiment of the present invention.

When effecting the global alignment, there are cases where it is desired to increase the transparent area for global alignment on the CCD image pickup surface. In such a case, it is only necessary to arrange so that as for example, the reflecting sections (23c, 23d) of the pattern plate 20 and the index marks (22c, 22d) on the index plate 13 are deviated in the X direction relative to the Y-direction line passing through the center within the image pickup area SA as shown in FIG. 9. By so doing, the transparent area VPAy, for example, can be increased as compared with the case of FIG. 7A, thereby improving the throughput during the global search. Also, as shown in FIG. 10, the reflecting sections (23c, 23d) and the index marks (22c, 22d) may each be extended partially up to the extent of the transparent area VPAy for use during the global alignment. Of course, alternatively or simultaneously the reflecting sections (23a, 23b) of the pattern plate 20 and the index marks (22a, 22b) may be arranged so that they are deviated in the Y direction relative to the X-direction line passing through the center within the image pickup area SA.

Also, as disclosed in U.S. Pat. No. 5,004,348, in a stepper of the type in which the die-by-die marks on a reticle R and the wafer marks for one shot on the wafer W are detected by a TTR (through the reticle) alignment system employing an interference-type alignment method, as shown in FIG. 1, an off-axis alignment system employing a wide-band illuminating light may be provided as shown in FIG. 1 and the grating wafer mark aligned by the TTR alignment system and the wafer mark detected by the alignment system using the wide-band illuminating light may be concurrently replaced by a multiple-pattern mark of a different duty ratio as shown in FIGS. 6A or 7A.

The alignment system employing the interference alignment method using these marks in common may be of the type which effects the mark detection without the intermediary of the reticle R. It is to be noted that where the interference alignment method is used for detecting the mark of low duty ratio such as shown in FIGS. 6A or 7A, a construction is adopted which is capable of detecting the±first-order diffracted beams as well as the 0-order and±second-order diffracted beams.

Figure 11:
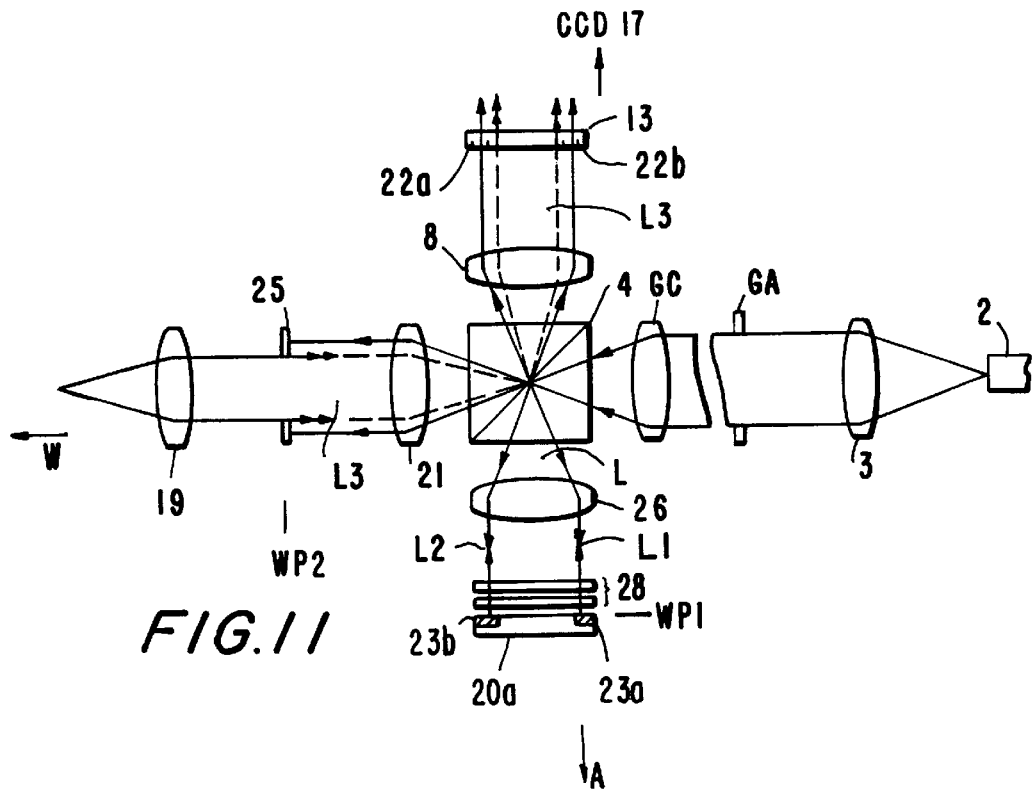
FIG. 11 is a schematic diagram showing a modification of the position detecting apparatus according to the embodiment of the present invention.
Figure 12:
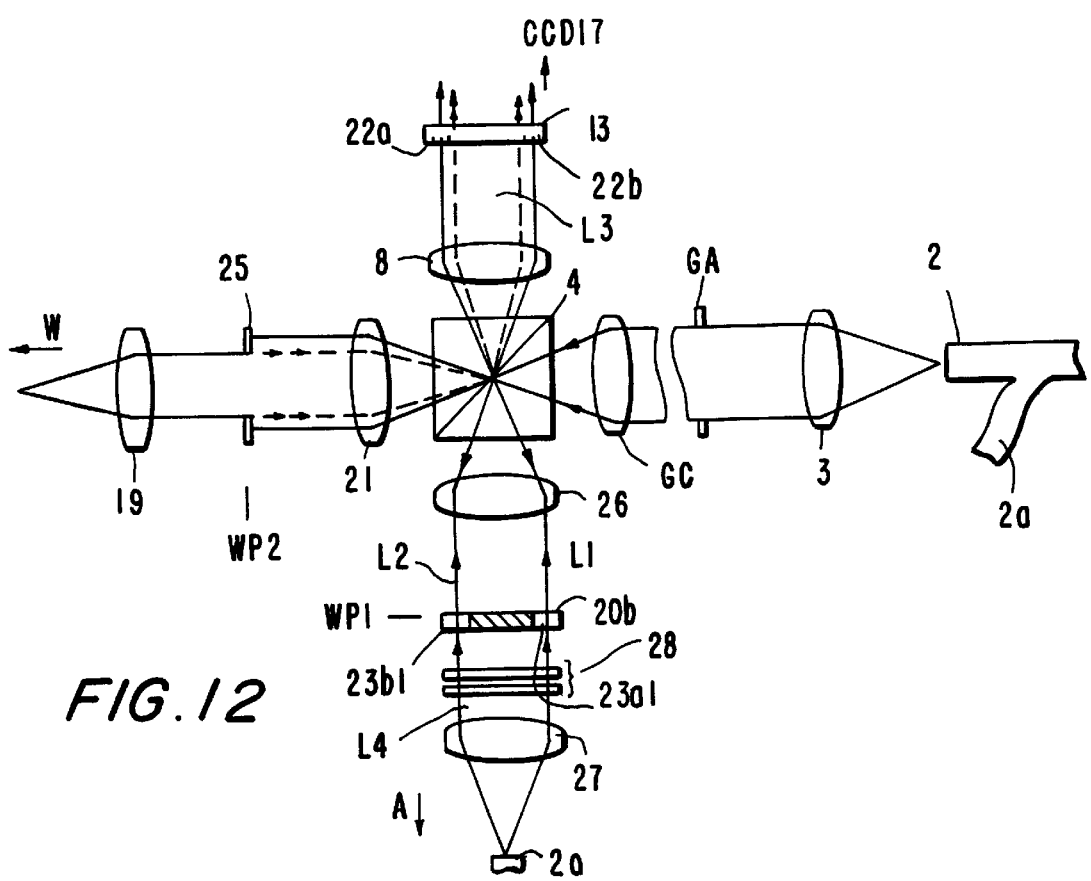
FIG. 12 is a schematic diagram showing another modification of the position detecting apparatus according to the embodiment of the present invention.

While the foregoing description has been made by taking the case of the system in which the reflection-type pattern plate 20 is arranged between the half mirror 4 and the wafer W, the present invention is not limited thereto. Modifications of the pattern plate 20 will now be described with reference to FIGS. 11 and 12. Note that each of FIGS. 11 and 12 shows the optical system of a part of the alignment sensor shown in FIG. 1. FIG. 11 shows a case in which the reflection-type pattern plate 20 is arranged on the lower side of the half mirror 4 in FIG. 1, and FIG. 12 shows a case in which the pattern plate 20 of a transmission type (light emission type) is arranged on the lower side of the half mirror 4.

A description will be first made of the case employing the reflection-type pattern plate 20 shown in FIG. 11. Here, for purposes of simplifying the description, the index marks 22*a* and 22*b* formed on the index plate 13 and the reflecting sections 23*a* and 23*b* will be explained mainly.

Referring to FIG. 11, the illuminating light from the light source is directed by the optical fiber bundle 2 to fall on the half mirror 4 through the condenser lens 3, the illuminating field stop GA and the lens system GC. This illuminating light is splitted by the half mirror 4 so that of these light beams, a light beam L reaches a pattern plate 20*a* through a lens system 26. The pattern plate 20*a* is arranged at a plane WP1 which is substantially conjugate to the wafer W and the pattern plate 20*a* is formed with reflecting sections 23*a* and 23*b* as the pattern plate 20 shown in FIG. 2. Also, the pattern plate 20*a* is constructed so that a reflection reducing film is formed on the other area than the reflecting sections of the pattern plate 20*a* and only the incident light beams to the reflecting sections 23*a* and 23*b* are reflected. The reflecting sections 23*a* and 23*b* are each formed by a film of vapor-deposited chromium on the pattern plate 20*a* at positions corresponding respectively to the index marks 22*a* and 22*b* on the index plate 13.

Also, rotational polarizing plates 28 are arranged between the lens system 26 and the pattern plate 20*a*. At least two units of the rotational polarizing plate 28 makes a set capable of suitably adjusting the light quantity for illuminating the index marks 22*a* and 22*b*, respectively.

The light beam L is reflected by the reflecting sections 23*a* and 23*b* of the pattern plate 20*a* thereby producing light beams L1 and L2. The light beam L1 is one which illuminates only the index mark 22*a* and the vicinity and the light beam L2 is one which illuminates only the index mark 22*b* and the vicinity. As a result, by picking up the light beams L1 and L2 transmitted through the index plate 13 by the CCD camera 17, it is possible to obtain image signals corresponding to the index marks 22*a* and 22*b* without being subjected to the effect of the return light from the wafer W. It is to be noted that the area of the pattern plate 20 other than the reflecting sections 23*a* and 23*b*, that is, the previously mentioned area formed with the reflection reducing film may be made a light transmitting area.

On the other hand, the illuminating light transmitted through the half mirror 4 is first reflected by the wafer W and is again returned to the half mirror 4. In this case, a stop 25 is provided at a plane WP2 which is positioned substantially conjugate to the wafer W between the half mirror 4 and the wafer W. The stop 25 is composed of a transparent portion excluding the other portion corresponding to the specified areas including the index marks 22*a* and 22*b* and the vicinity on the index plate 13 (i.e., the areas corresponding to the reflecting sections 23*a* and 23*b* and the vicinity on the pattern plate 20*a*). After passing through the transparent portion of the stop 25, the return light L3 from the wafer W is projected onto the CCD camera 17 through the half mirror 4, the imaging lens 8 and the index plate 13 in this order and a magnified image of the mark MXn on the wafer W is picked up by the CCD camera 17.

It is to be noted that instead of arranging the transmission-type index plate 13 between the imaging lens 8 and the CCD camera 17, a reflection-type index plate such as one combining the pattern plate 20*a* and the index plate 13 in one unit may be arranged at the position WP1 which is substantially conjugate to the wafer W. In this case, the index marks formed on the reflecting sections 23*a* and 23*b* are illuminated by reflection. Such a system will be described later.

Next, a description will be made of the case in which the pattern plate 20 is in the form of a transmission type (or light emission type).

FIG. 12 shows an example in which a transmission-type pattern plate 20*b* is used in place of the reflection-type pattern plate 20*a* shown in FIG. 11. For purposes of simplification, a description will be made only with respect to the index marks 22*a* and 22*b*. In FIG. 12, the pattern plate 20*b* is positioned at a plane WP1 which is substantially a conjugate position to the wafer W. The pattern plate 20*b* includes transparent portions $23a_1$ and $23b_1$ forming specified areas respectively corresponding to the index marks 22*a* and 22*b* of the index plate 13 and the other portion forms a light shielding portion. Also, a reflection reducing treatment is performed on its other surface facing the half mirror 4.

The optical fiber bundle 2 has a branch fiber bundle 2*b*, and this branch fiber bundle 2*a* has the purpose of illuminating the pattern plate 20*b* through a lens system 27 from the side opposite to the half mirror 4. In FIG. 12, the light beam L4 emitted from the branch fiber bundle 2*b* is entered into the pattern plate 20*b* from below. After passing through the transparent portions $23a_1$ and $23b_1$ of the pattern plate 20*b*, the light beams L1 and L2 are transmitted through the specified areas or the index marks 22*a* and 22*b* of the index plate 13 and the vicinity through the lens system 26, the half mirror 4 and the imaging lens 8. These light beams L1 and L2 are picked up by the CCD camera 17 and thus the image signals corresponding to the index marks 22*a* and 22*b* are obtained without being affected by the return light from the wafer W. Also, in this case the light quantity of the illuminating light from the branch fiber bundle 2*a* is suitably adjustable by the rotational polarizing plates 28. Further, as in the case when the pattern plate 20*a* shown in FIG. 11 is used, after passing through the stop 25, the return light L3 from the wafer W is projected onto the CCD camera 17 through the half mirror 4, the imaging lens 8 and the index plate 13 thereby permitting the CCD camera 17 to pick up the wafer mark MXn.

It is to be noted that while the optical fiber bundle 2*a* is branched off the optical fiber bundle 2, if, instead of, the pattern plate 20*b* is composed of a self light emitting-type pattern plate whose transparent portions $23a_1$ and $23b_1$ emit light with a uniform illumination distribution, the branch fiber bundle 2*a* is not needed. Also, instead of separately arranging the transmission-type pattern plate 20*b* and the transmission-type index plate 13 before and after the half mirror 4, only a transmission-type index plate of the kind combining the pattern plate 20*b* and the index plate 13 in one unit may be arranged between the imaging lens 8 and the CCD camera 17. This combination-type index plate is such that only the specified areas or the index marks 22*a* and 22*b* and the vicinity form transparent portions and the remainder area is composed of a light shielding portion.

In each of the above-mentioned embodiments, the system is used so that the illuminating light from the light source is transmitted through the half mirror 4 toward the wafer W and the return light from the wafer W is reflected and separated toward the CCD camera 17 by the half mirror 4. However, the present invention is not limited to the apparatus employing such system and it is of course possible to use a system whereby the illuminating light from the light source is reflected and separated by the half mirror to reflectively illuminate the wafer and the return light from the wafer is transmitted through the half mirror to reach the CCD camera. Also, in this case, the pattern plate 20, 20*a* or 20*b* may be applied in a variety of ways.

Figure 13:
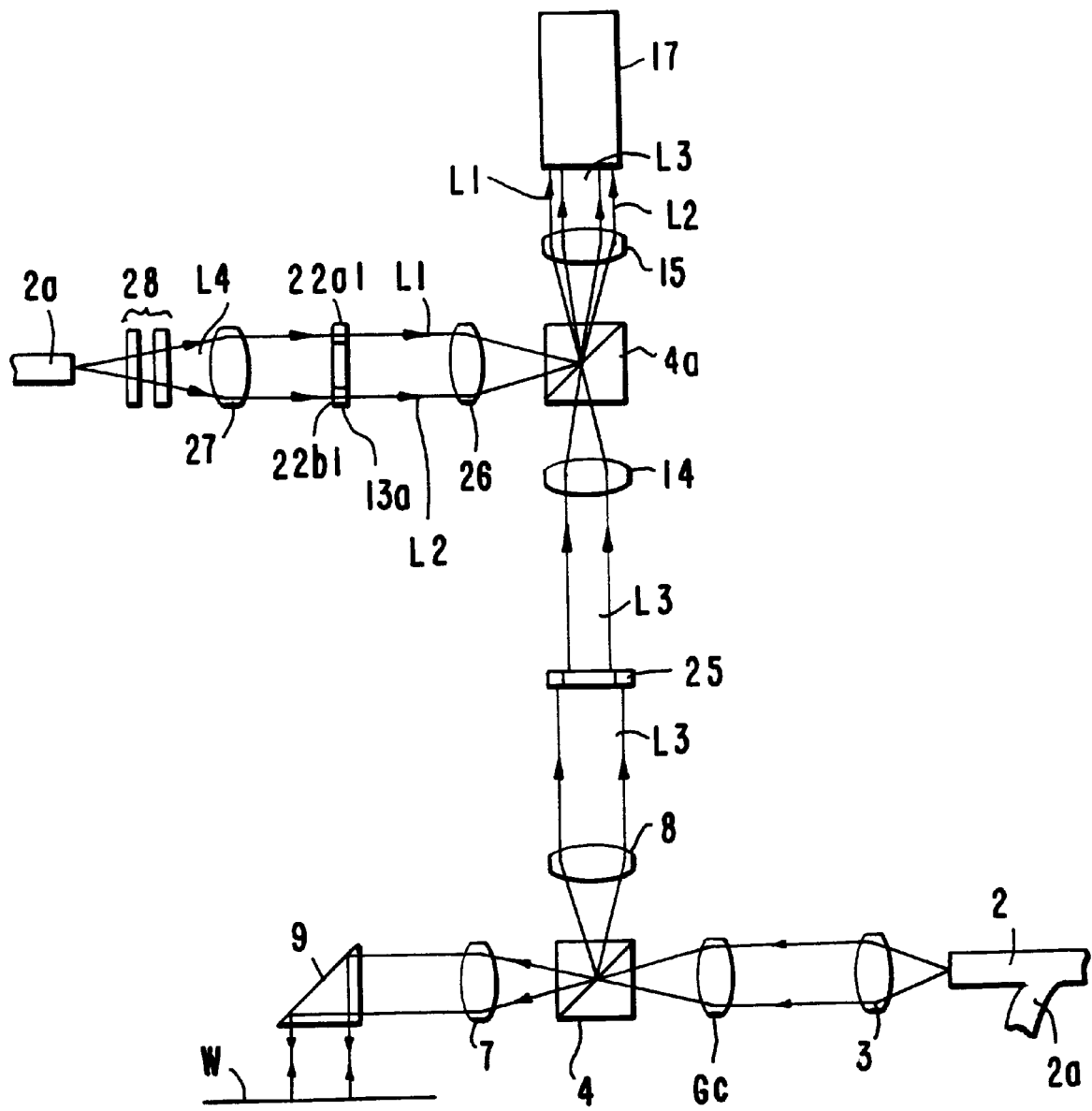
FIG. 13 is a schematic diagram showing still another modification of the position detecting apparatus according to the embodiment of the present invention.

FIG. 13 shows another system employing a pattern plate of a transmission type (or a light emission type). Here, for purposes of simplification, a description will also be made only with respect to the index marks 22*a* and 22*b*. In FIG.

13, an index plate 13a is of the previously mentioned type combining a transmission-type pattern plate and a transmission-type index plate in one unit and it is arranged at a plane which is substantially conjugate to the wafer W. This index plate 13a can be made by bonding for example the previously mentioned transmission-type pattern plate of FIG. 12 and the index plate 13 together. With this index plate 13a, only the specified areas $22a_1$ and $22b_1$ respectively including the index marks 22a and 22b formed as portions which are illuminated by the transmitting light beams and the other portion is formed to serve as a light shielding portion.

In FIG. 13, the branch fiber bundle 2a branched from the optical fiber bundle 2 for directing the source light is arranged for transmission and illumination of the index plate 13a through the rotational polarizing plates 28 and the lens system 27. The illuminating light beam L4 emitted from the branch fiber bundle 2a is irradiated on the index plate 13a so that the light beams L1 and L2 transmitted through the index mark areas $22a_1$ and $22b_1$ of the index plate 13a enter into a half mirror 4a through the lens system 26, are reflected and separated by the half mirror 4a and are projected onto the CCD camera 17 through the image pickup lens 15. Thus, the image signals corresponding to the index marks 22a and 22b are produced from the CCD camera 17 without being affected by the return light from the wafer W. In this case, the light quantity of the illuminating light is properly adjustable through the adjustment by the rotational polarizing plates 28.

On the other hand, the illuminating light from the optical fiber bundle 2 is irradiated on the wafer W through the lenses 3 and GC, the half mirror 4, the objective lens 7 and the prism 9. The return light L3 reflected from the wafer W passes through the prism 9, the objective lens 7, the half mirror 4, the imaging lens 8 and the stop 25 in the like manner as the case shown in FIGS. 11 or 12, is transmitted through the half mirror 4a by way of the image pickup lens 14 and is projected onto the CCD lens 17 by the image pickup lens 15. In this way, the wafer mark MXn on the wafer W can also be picked up by the CCD camera 17.

Of course, the combination-type index plate 13a can be replaced by the separate construction comprising the transmission-type index plate 13 and the reflection-type pattern plate 20a or the transmission-type pattern plate 20b as in the case of FIGS. 11 or 12. Also, instead of illuminating the index marks by the splitted illuminating light from the branch fiber bundle 2a or the like, the pattern plate 20b may be composed of a self light emission-type pattern plate whose transparent portions $23a_1$ and $23b_1$ emit light with a uniform illumination distribution, thereby illuminating the index marks.

The system of FIG. 13 is advantageous in that there is no need to perform any reflection reducing treatment on the pattern plate and the index plate.

Figure 14:
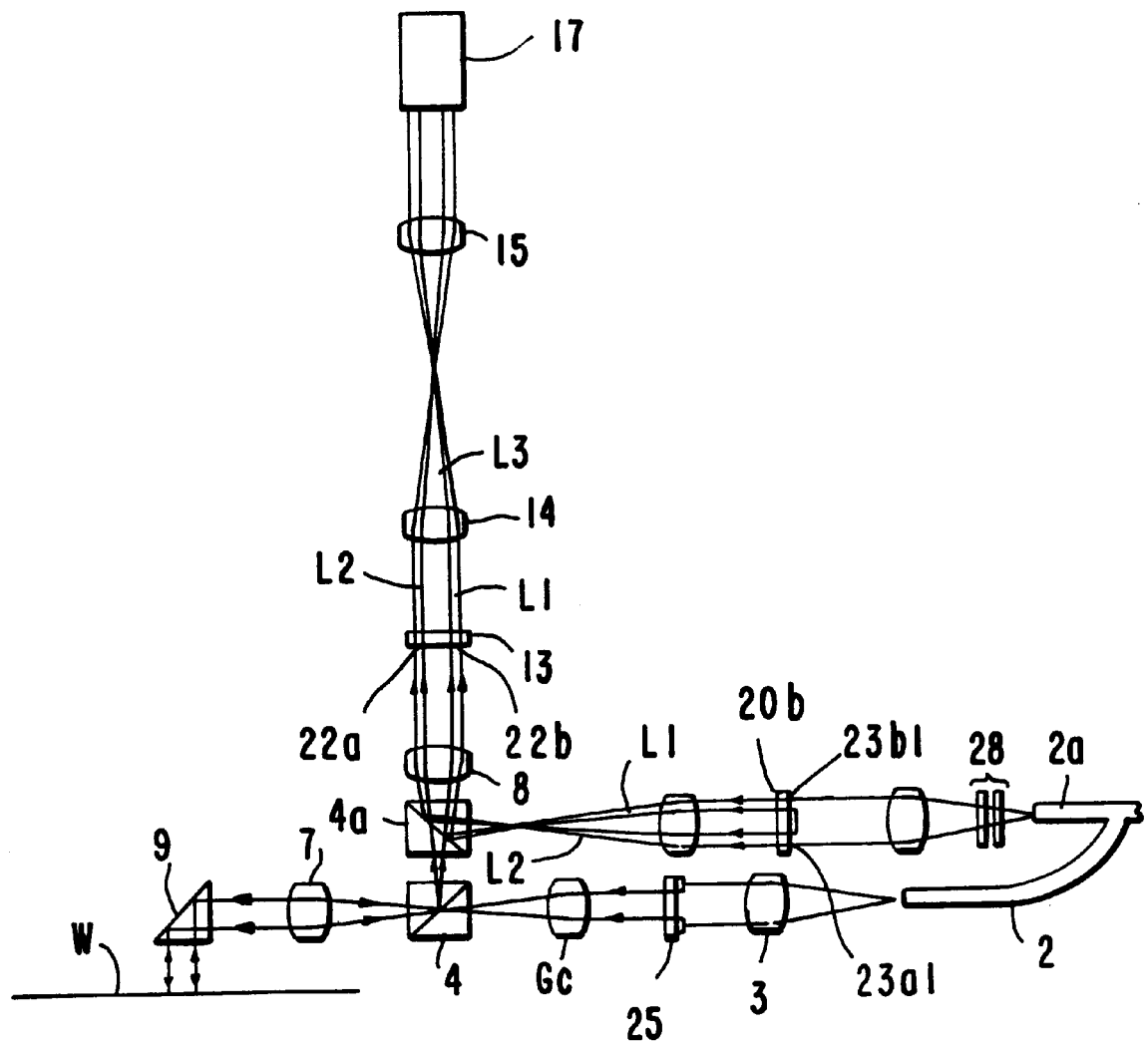
FIG. 14 is a schematic diagram showing still another modification of the position detecting apparatus according to the embodiment of the present invention.

FIG. 14 shows still another modification of the system and the components which are the same in effect with those of the previously mentioned modified systems are designated by the same reference numerals. In this modification, the pattern plate 20b and the stop 25 are each arranged at a position which is substantially conjugate to the wafer W in one of the two illuminating systems and the illumination area is limited on the light source side of the respective beam splitters (half mirrors) 4 and 4a, thereby separately illuminating the index plate 13 and the wafer W.

Also, the interference alignment method can be incorporated in the off-axis alignment employing the wide-band illuminating light as explained in connection with the previously mentioned modifications, thereby concurrently using the line mark of the type shown in FIGS. 6 or 7 during the alignment. One such system incorporating the interference alignment method in the off-axis alignment system employing the wide-band illuminating light is disclosed for example in U.S. Pat. No. 4,962,318.

Further, while, with the previously mentioned modifications, the alignment system employing the wide-band illuminating light is constructed so as to detect the marks without the intermediary of the projection lens 10 as shown in FIG. 1, each of the modifications can be applied to those alignment systems of the type which detects the marks through the intermediary of the projection lens 10. For instance, it is only necessary to provide a system so that the objective lens 7 of FIG. 1 serves as an aberration compensation lens and the light beam from the prism 9 illuminates the wafer W through the projection lens 10.

A second embodiment of the present invention will now be described. While the previously mentioned first embodiment and its modifications are of the type in which the transmission-type index plate is subjected to transmission illumination, the second embodiment uses a reflection-type index plate.

Figure 15:
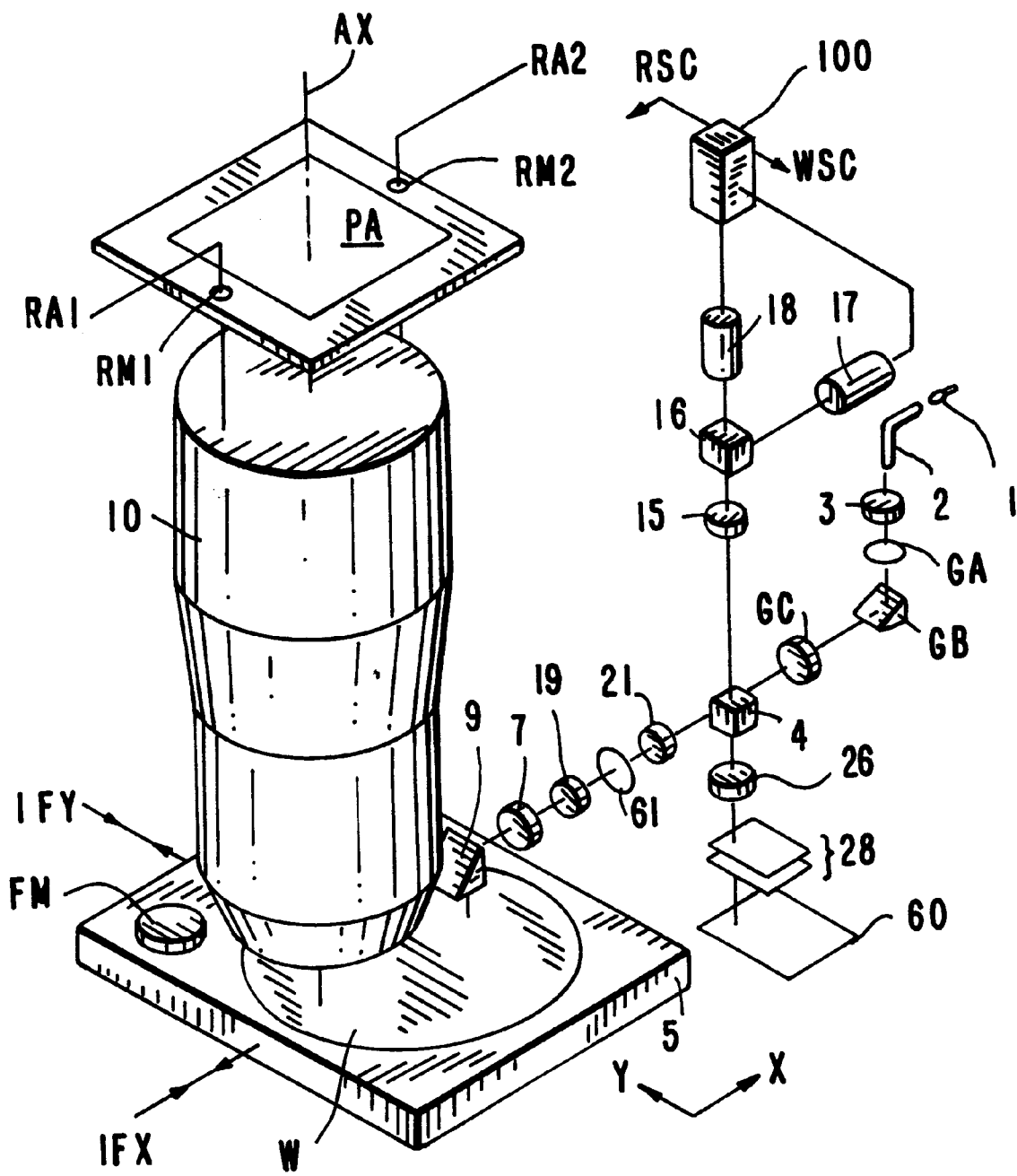
FIG. 15 is a schematic diagram showing the construction of the principal parts of a projection exposure apparatus equipped with the position detecting apparatus according to another embodiment of the present invention.

Referring to FIG. 15, there is illustrated a schematic diagram showing the construction of a projection exposure apparatus equipped with a position detecting apparatus according to the second embodiment and the components which are the same in effect with their counterparts of FIG. 1 are designated by the same reference numerals. Here, the illuminating light from a light source 1 is divided by a half mirror 4 into two parts which are respectively directed to a wafer W and a reflection-type index plate 60, and the return light beams (reflected light beams) from these components are combined on a separate optical path by the half mirror 4 so as to direct it to an image pickup device 17 or 18. Thus, after the division by the half mirror 4, the respective illuminating light beams for illuminating the wafer W and the index marks of the reflection-type index plate 60 serve as independent illuminating light beams which are separate from each other and therefore they have no effect on each other.

Figure 16:
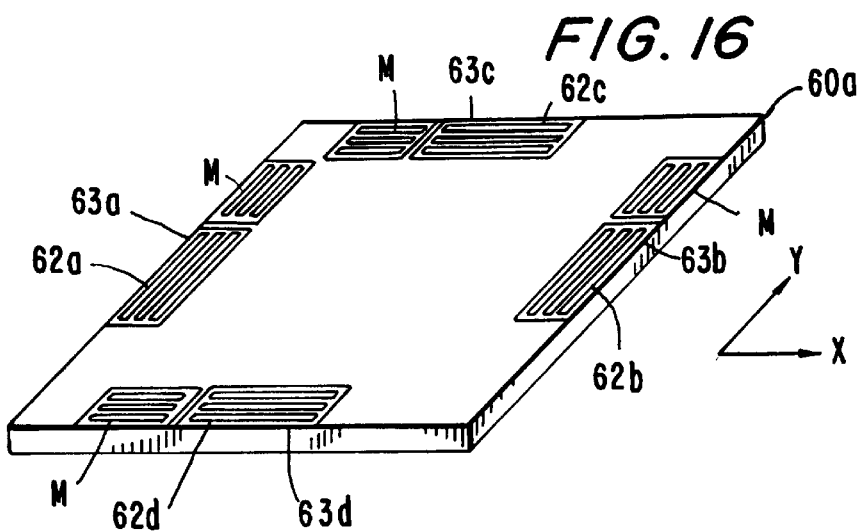
FIG. 16 is a perspective view showing the arrangement relation between the reflecting sections and the index marks on the reflection-type index plate in the second embodiment of the present invention.

With the construction described above, the reflection-type index plate 61, a stop 60 and the image pickup surfaces of the CCD cameras 17 and 18 are each arranged at a position which is substantially conjugate to the wafer W. Here, the reflection-type index plate 60 is formed with a plurality of reflecting sections 63a, 63b, 63c and 63d each made of a film of vapor-deposited chromium with such position and shape as shown in FIG. 16 and index marks 62a, 62b, 62c and 62d are respectively formed with the chromium non-deposited portions of these reflecting sections. The CCD cameras 17 and 18 respectively simultaneously pick up the images of wafer marks MXn and MYn on the wafer mark W and the images of the index marks 62a to 62d on the index plate 60.

The reflection-type conjugate index plate 60 of FIG. 16 will now be described in greater detail. The index plate 60 is a flat plate made of a light transmission material such as glass and it has the reflecting sections 63a, 63b, 63c and 63d. The reflecting sections 63a to 63d are formed by vapor-depositing chromium or the like on the glass surface and three fine lines are formed by the chromium non-deposited portions of each reflecting section thereby providing the index marks 62a to 62d. The index marks 62a and 62b are arranged in the X direction so as to be substantially parallel to each other with a given spacing therebetween and the index marks 62c and 62d are arranged in the Y direction so as to be substantially parallel to each other with a similar given spacing therebetween. Then, during the X-direction alignment the stage actuation brings about a condition in which the wafer mark MXn is inserted between the index marks 62a and 62b within the image, thereby effecting the position detection. Similarly, during the Y-direction alignment the stage actuation brings about a condition in which the wafer mark MYn is inserted between the index marks 62c and 62d within the image, thereby effecting the position detection.

With this index plate 60, the illuminating light from the light source I such as a halogen lamp is reflected by the reflecting sections 63a to 63d so that image signals of the index marks 62a to 62d are produced from the reflected light beams and thus there is no need to use the return light beams from the wafer W. Also, the illuminating light quantity to the index plate 60 is suitably adjustable by rotational polarizing plates 28. Then, the light beams returned from the wafer W and passed through the stop 61 and the return light beams from the reflection-type index plate 60 are separated by a half mirror 16 through the half mirror 4 and a lens 15 and are respectively projected again onto the X-axis alignment CCD camera 17 and the Y-axis alignment CCD camera 18.

As a result, the mark images of the index marks 62a to 62d are projected onto the CCD cameras 17 and 18, respectively. It is to be noted that the reflecting sections 63a to 63d are not limited to those made of chromium provided that they reflect the illuminating light. Also, the stop 61 selectively transmits the light which illuminates the areas containing the wafer marks on the wafer W (that is, the portions of the wafer W which correspond to the area of the index plate 60 excluding the specified areas containing the index marks 62a to 62d and the reflecting sections 63a to 63d) and it absorbs and blocks the light with respect to the other portion.

Since each of the index marks 62a to 62d comprises three parallel bar marks, the resulting video signal waveform takes the form of a waveform which involves a bottom (minimum value) for each of the bar marks as in the case of the first embodiment shown in FIG. 5B. The positions of the wafer marks are detected from such video signals by a processor 50.

Also, where the alignment sensor shown in FIG. 15 is used for the purpose of global alignment as in the case of the first embodiment, it is conceivable to use a method of separately taking in the signals from the index marks and the signals from the wafer marks and effecting the position detection (alignment). Firstly, the signals from the index marks 62a and 62b are received and the alignment is effected to obtain an index center Xc. Then, while the signal from the wafer mark is received, at this time it is arranged so that the illuminating light for the reflection-type index plate 60 is entirely blocked by the rotational polarizing plates 28. Also, the stop 61 is made movable and it is removed from the optical path. By so doing, it is possible to increase the signal receiving areas of the wafer W. This is effective not only when the alignment sensor shown in FIG. 15 is used for the purpose of global alignment but also when the alignment marks for fine alignment are greater than the inter-index distance of the index marks 62a and 62b. It is to be noted that this can be similarly effected in the first embodiment by making the stop (visual field limiting means) 25.

Further, while, in the second embodiment, the single index plate 60 is formed with the X-direction alignment index marks and the Y-direction alignment index marks, these index marks may be respectively formed on separate X-direction and Y-direction index plates as in the case of the first embodiment. Also, even in the second embodiment, it is possible to apply wafer marks having a small duty ratio such as shown in FIGS. 6A or 7A as in the case of the first embodiment and it is also possible to construct the index marks and the reflecting sections to have such shape and arrangement as shown in FIGS. 9 or 10.

Also, where the reflecting sections 63a to 63d of the reflection-type index plate 60 are so high in reflectance that the detection light from the index marks becomes excessively high in light intensity as compared with the detection light from the wafer marks despite the compensation by the rotational polarizing plates, a modified index plate 60a formed with a separate index mark in addition to the index marks 62a to 62d of the second embodiment may be arranged at a position which is substantially conjugate to the wafer W. Since the index mark M is illuminated by the reflected light from the wafer W as in the past, the index mark M is arranged within the illumination area SA other than specified areas corresponding to the reflecting sections 63a to 63d and the vicinity on the index plate 60a. Then, as in the case of the first embodiment, the selection between the use of the index marks 62a to 62d and the use of the index mark M is made in accordance with the difference in reflectance between the wafer W and the reflecting sections 63a to 63d.

Figure 17:
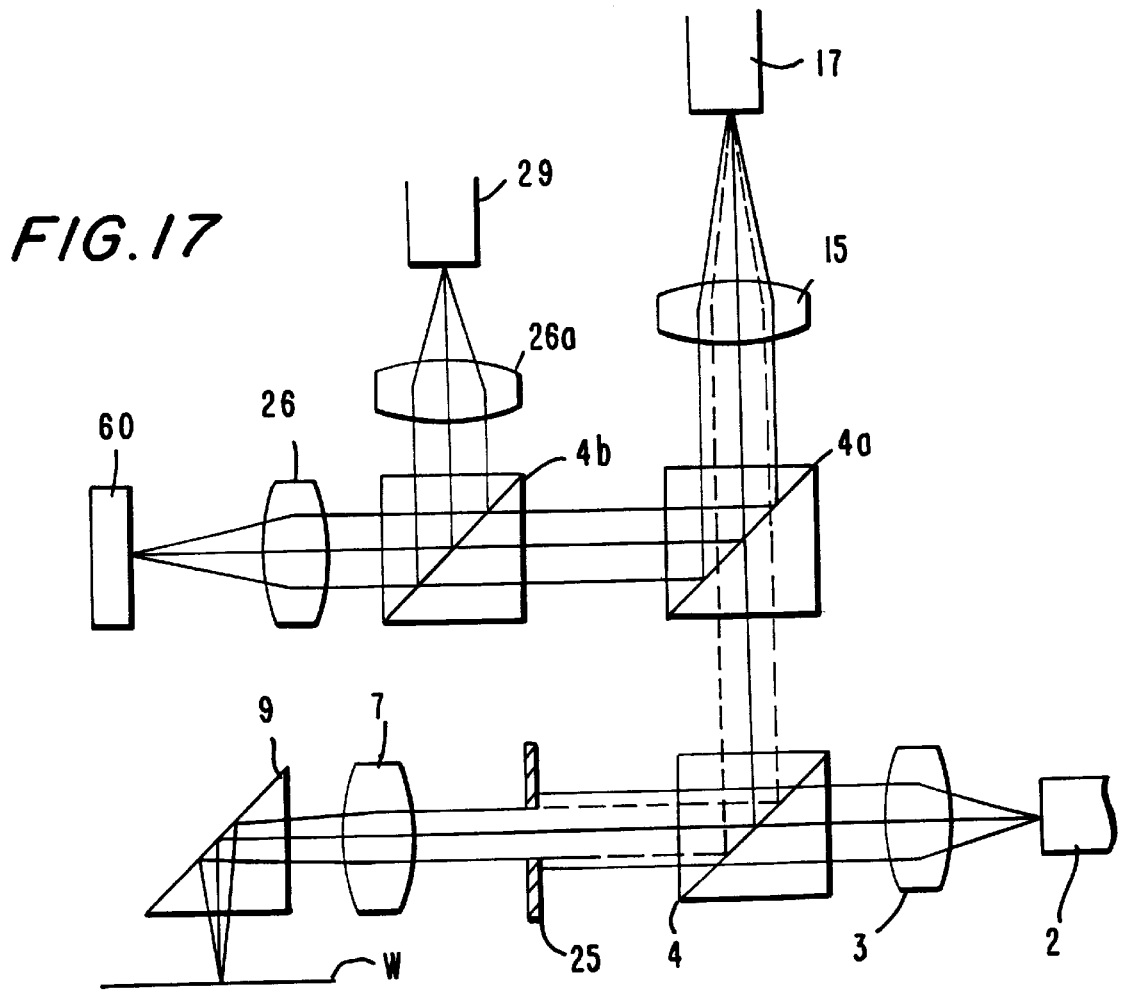
FIG. 17 is a schematic diagram showing a modification of the position detecting apparatus according to the second embodiment of the present invention.
Figure 18:
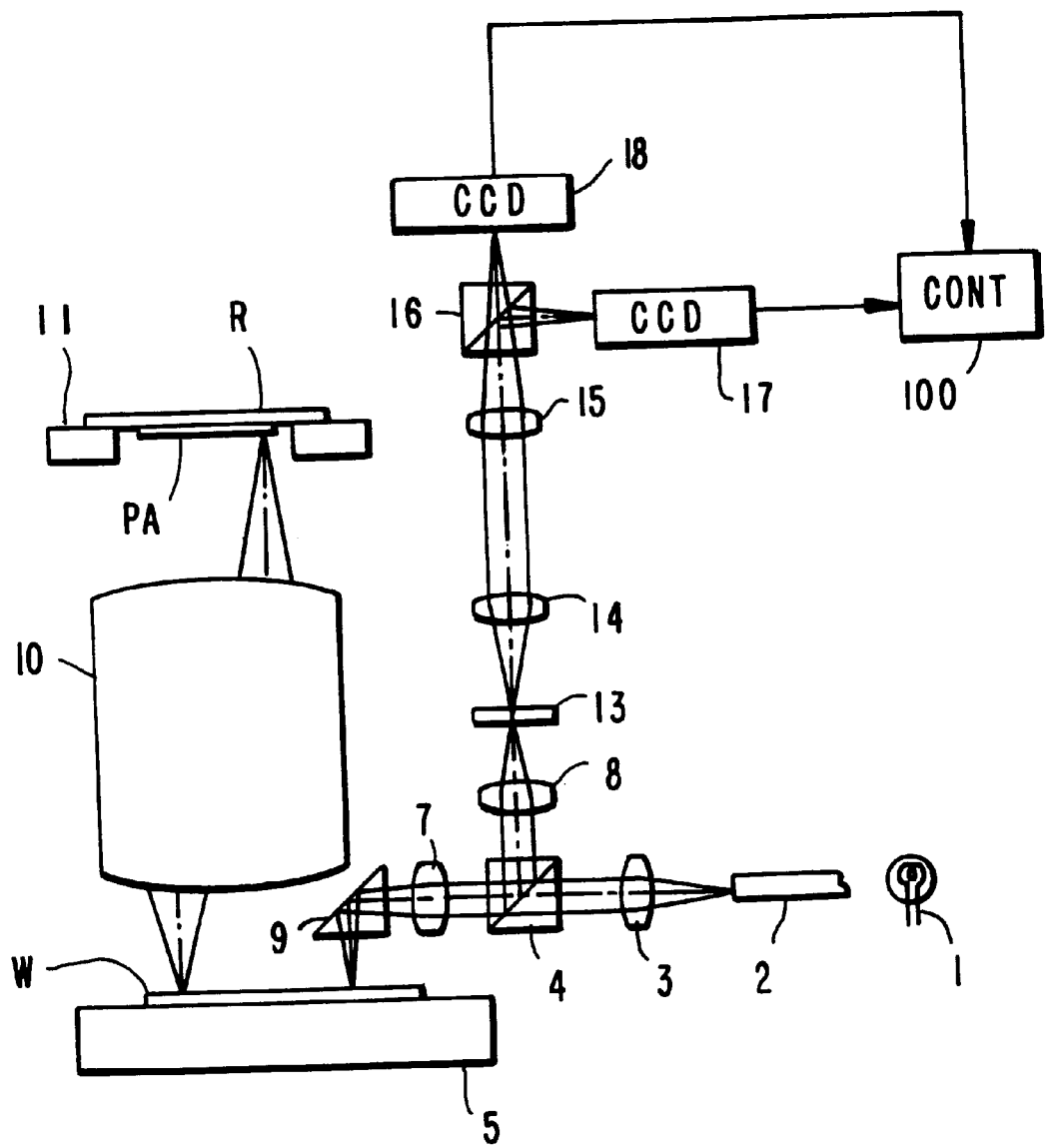
FIG. 18 is a schematic diagram showing the construction of a projection exposure apparatus provided with a conventional position detection system.

Referring to FIG. 17, there is illustrated a modification of the detection system according to the second embodiment. In this modification, a light source 29 for illuminating the reflection-type index plate 60 is provided separately from the light source for illuminating the wafer W or the optical fiber bundle 2 and the two illuminating systems are independently of each other. Here, for purposes of simplicity, a description will be made only with respect to the index marks 62a and 62b.

In FIG. 17, the light emitted from the light source 29 such as an LED passes through lens systems 26 and 26a and a half mirror 4b and illuminates the reflection-type index plate 60. Also, the return light reflected from the index plate 60 is picked up by the CCD camera 17 through the half mirror 4a. As a result, the image signals corresponding to the index marks 62a and 62b can be produced without being affected by the return light from the wafer W. In this case, due to the fact that the light source 29 comprises a self light emitting device such as LED, the illuminating light quantity can be adjusted without use of the rotational polarizing plates 28, that is, by adjusting for example the voltage supplied to the LED. Also, even with this system, as in the case of the system of FIG. 15, by setting the light quantity of the LED to zero and making the stop 61 movable, it is possible to align the index marks and the wafer marks independently of each other.

It should be understood that the foregoing embodiments have been disclosed for the purpose of illustration only, and it is needless to say that the present invention is not limited to these embodiments and any person skilled in the art can make various changes and modifications thereto within the technical scope in accordance with the subject matter stated in the appended claims.

What is claimed is:

1. In an apparatus for detecting a position of a first mark formed on a substrate in accordance with an image signal resulting from the detection of said first mark and a second mark formed on an index plate arranged at a position which is substantially conjugate to said substrate with respect to an objective optical system including an image pickup device, the improvement comprising:

(a) an image optical system whereby said index plate and said image pickup device are arranged in a substantially optical conjugate relation to each other with respect to said imaging optical system;

(b) first illumination system, that produces an illuminating light not including reflected light from said substrate for illuminating a first area containing said second mark on said index plate;

(c) second illumination system optically connected to said objective optical system for substantially vertically illuminating through said objective optical system a localized area of said substrate corresponding to an area of said index plate other than said first area, said second illumination system illuminating at least said localized area on said substrate by a light of a wide band of wavelengths; and (d) said image pickup device for detecting an image of said first mark formed on said substrate and an image of said second mark formed on said index plate and generating a corresponding image signal when said first mark on said substrate is positioned within said localized area.

2. An apparatus according to claim 1, further comprising light shielding means whereby of said reflected light from said substrate, light capable of illuminating said first area is intercepted.

3. An apparatus according to claim 1, wherein said first and second illumination system are coaxial with respect to the optical axes thereof.

4. An apparatus according to claim 1, wherein said second mark is arranged so as to be displaced to one side of a center line on a surface of said index plate.

5. An apparatus according to claim 1, further comprising means for adjusting a light quantity of the illuminating light from at least one of said first and second illumination system.

6. An apparatus according to claim 1, further comprising:

a third mark formed on said second area of said index plate;

said image pickup device for generating a first image signal corresponding to said first mark, a second image signal corresponding to said second mark and a third image signal corresponding to said third mark;

selecting system for selecting either one of said second image signal and said third image signal generated from said image pickup device; and detection apparatus for detecting the position of said first mark in accordance with said first image signal and either one of said second image signal and said third image signal selected by said selected system.

7. In an apparatus for detecting a position of a first mark formed on a substrate in accordance with an image signal produced by an image pickup device detecting said first mark and a light shielding second mark of a given shape formed on an index plate arranged at a position which is substantially conjugate to said substrate with respect to an objective optical system, the improvement comprising:

(a) said index plate made of a light transmission material and formed with said second mark in a portion thereof;

(b) an imaging optical system whereby said index plate and said image pickup device are arranged in a substantially optical conjugate relation to each other with respect to said imaging optical system;

(c) first illumination system, that produces an illuminating light not including a reflected light from said substrate for illuminating a first area containing said second mark on said index plate;

(d) second illumination system optically connected to said objective optical system for substantially vertically illuminating through said objective optical system a localized area of said substrate corresponds to an area other than said first area on said index plate, said second illumination system illuminating at least said localized area on said substrate by a light of a wide band of wavelengths; and (e) said image pickup device for detecting an image of said first mark on said substrate and an image of said second mark and generating a corresponding image signal when said first mark is positioned within said localized area.

8. An apparatus according to claim 7, further comprising:

reflecting surface member for partially reflecting the illuminating light from said second illumination system;

a relay optical system arranged between said index plate and said reflecting surface member with said reflecting surface member and said index plate being arranged in a substantially optically conjugate relation to each other with respect to said relay optical system; and an optical system arranged between said index plate and said reflecting surface member for introducing a first reflected light from said reflecting surface member and a second reflected light from said substrate into said index plate.

9. In an apparatus for detecting a position of a first mark formed on a substrate in accordance with an image signal produced by an image pickup device detecting said first mark and a second mark having a light shielding property and formed with a given shape on an index plate arranged at a position which is substantially conjugate to said substrate with respect to an objective optical system, the improvement comprising:

(a) said index plate made of a light transmitting material and formed with said second mark in a portion thereof;

(b) an imaging optical system whereby said index plate and said image pickup device are arranged in a substantially optical conjugate relation to each other with respect to said imaging optical system;

(c) first illumination system that produces an illuminating light for illuminating substantially the whole surface of said index plate;

(d) beam limiting system for limiting part of an illumination light from said first illuminating system in such a manner that only an image of said first area containing said second mark of said index plate is focused on said image pickup device through said imaging optical system;

(e) second illumination system optically connected to said objective optical system for substantially vertically illuminating through said objective optical system a localized area on said substrate which corresponds to an area other than said first area on said index plate, said second illumination system illuminating at least said localized area on said substrate by a light of a wide band of wavelengths;

(f) a combining optical system for combining a light beam transmitted through said first area of said index plate as a return light beam returned from said localized area through said objective optical system on the same axis; and (g) said image pickup device for detecting an image of said first mark and an image of said second mark respectively formed on said image pickup device through said objective optical system and said imaging optical system and producing a corresponding image signal when said first mark on said substrate is positioned within said localized area.

10. In an apparatus for detecting a first mark formed on a substrate to be subjected to position detection by image pickup means through an objective optical system so as to detect a position of said first mark in accordance with a signal from said image pickup means, the improvement comprising:

(a) reflection-type index plate arranged at a position which is substantially conjugate to said substrate with respect to said objective optical system and formed with a second mark of a given shape;

(b) first illumination system that produces an illuminating light not including reflected light from said substrate for illuminating a first area containing said second mark on said index plate;

(c) second illumination system optically connected to said objective optical system for substantially vertically illuminating through said objective optical system a localized area on said substrate which corresponds to an area other than said first area on said index plate, said second illumination source illuminating at least said localized area on said substrate by a light of a wide band of wavelengths;

(d) an imaging optical system for directing a reflected light beam reflected from said index plate by the illumination from said first illumination means and focusing an image of said second mark on an area of an image pickup surface of said image pickup means other than an area where an image of said first mark is formed; and (e) detection system for detecting a position of said first mark in accordance with an image signal generated from said image pickup device and corresponding to the image of said first mark and the image of said second mark.

11. An exposure apparatus which transfers a mask pattern onto a substrate comprising:

a projection type optical system, which projects said mask pattern onto said substrate;

an index plate having an index pattern formed thereon which is used for aligning said substrate;

a first illumination system which illuminates said index pattern;

a second illumination system which illuminates a marked localized area of said substrate with the illumination of at least said localized area being performed using light having a wide band wavelength; and an image capturing system which detects the images of the mark on said substrate and of said index pattern without letting light pass through said projection type optical system and further detects the image of said index pattern; and having a control system connected to said image capturing system to align said substrate according to the output from said image capturing system.

12. An exposure apparatus as set forth in claim 11 wherein said first illumination system illuminates said index pattern regardless of the light reflected from said substrate.

13. An exposure apparatus as set forth in claim 11 further comprising:

an optical member that prevents the reflected light coming from said substrate from irradiating onto said index pattern.

14. An exposure apparatus as set forth in claim 11 wherein said first illumination system includes a reflection plate which reflects light from said second illumination system selectively onto said index pattern.

15. An exposure apparatus as set forth in claim 11 wherein said first illumination system includes a shielding member such that the light emitted to illuminate said index plate is limited to the area in which said index pattern is formed not including any other area.

16. An exposure apparatus as set forth in claim 11 wherein said first illumination system further includes an adjusting device that adjust the amount of illumination light irradiated onto said index pattern.

17. An exposure method by which a mask pattern is transferred onto a substrate via a projection type optical system comprising the following steps:

formation of an image of a localized area on said substrate having an alignment mark by illuminating said localized area with light of a wide band wavelength;

formation of an image of a predetermined area having an index pattern on an index plate by illuminating said predetermined image independently from said substrate;

image capturing of the alignment mark on said substrate by illuminating a light of said wide band wavelength without passing light through said projection type optical system; and image capturing of said index pattern illuminated independently from said substrate to align said substrate according to the results of said image capturing.

18. The exposure method as set forth in claim 17 further including the step of synthesizing light from said predetermined area and from the reflected light coming from said localized area.

19. The exposure method as set forth in claim 18 further including the step of preventing the area in which said index pattern is formed from exposing itself to the light reflected from said substrate and capturing the images of the mark on substrate and said index pattern simultaneously.

20. The exposure method as set forth in claim 17, wherein the amount of light irradiated onto the area in which said index pattern is formed on said substrate is adjustable.

21. An exposure apparatus which transfers a mask pattern onto a substrate comprising:

an image capturing system which detects an image of an alignment mark generated by illuminating said alignment mark on said substrate by means of light of wide band wavelength;

an optical member including a reflection surface on which an index mark used for aligning said substrate is made on said optical member;

an index illumination system which illuminates said index mark on said optical member;

wherein said image capturing system detects an image of said index mark generated by the light coming from said index illumination system; and wherein the image signals corresponding to the image of said alignment mark and to the image of said index mark is outputted such that alignment of said substrate is performed according to said image signals.

22. The exposure apparatus as set forth in claim 21 further comprising a projection type optical system that projects the image of said mask pattern onto said substrate; and wherein said image capturing system detects the images of said index mark and said alignment mark without letting the light pass through said projection type optical system.

23. The exposure apparatus as set forth in claim 21 further comprising a mark illumination system which illuminates the localized area including said alignment mark on said substrate by means of light of wide band wavelength; with said index illumination system being at least partly different from said mark illumination system.

24. An exposure apparatus as set forth in claim 23 wherein said index illumination system includes a first light source and said mark illumination system includes a second light source which is different from said first light source.

25. An exposure apparatus as set forth in claim 21 wherein said index illumination system includes an adjustment device which adjust the amount of light irradiated onto said index mark.

26. An exposure method by which a mask pattern is transferred onto a substrate via a projection type optical system comprising the following steps:

illuminating said localized area marked on said substrate having the alignment mark by means of a light of a wide band wavelength;

illuminating, independently from said substrate, a predetermined area including said index pattern of an optical member having a reflection surface on which an index pattern used for alignment of said substrate is performed;

detecting the mark on said substrate illuminated with a light of said wide band of wavelength and detecting said index pattern illuminated independently from the illumination given to said substrate such that aligning of said substrate is performed according to the results of said detection.

27. The exposure method as set forth in claim 26 detects the image of said alignment mark without letting the light pass through said projection type optical system.

28. The exposure method as set forth in claim 26 wherein the amount of light irradiated onto said index pattern is adjustable.

29. The exposure method as set forth in claim 26 wherein an synthesized image of said alignment mark image and the image of said index pattern are photoelectrically detected.

* * * * *